US008946820B2

(12) United States Patent  (10) Patent No.: US 8,946,820 B2
Mitani  (45) Date of Patent: Feb. 3, 2015

(54) METHOD FOR MANUFACTURING SEMICONDUCTOR SUBSTRATE, SUBSTRATE FOR FORMING SEMICONDUCTOR SUBSTRATE, STACKED SUBSTRATE, SEMICONDUCTOR SUBSTRATE, AND ELECTRONIC DEVICE

(75) Inventor: Masahiro Mitani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/117,158

(22) PCT Filed: Jun. 26, 2012

(86) PCT No.: PCT/JP2012/066299
§ 371 (c)(1),
(2), (4) Date: Nov. 12, 2013

(87) PCT Pub. No.: WO2013/002227
PCT Pub. Date: Jan. 3, 2013

(65) Prior Publication Data
US 2014/0183636 A1  Jul. 3, 2014

(30) Foreign Application Priority Data
Jun. 30, 2011 (JP) ................................. 2011-146529

(51) Int. Cl.
*H01L 27/12* (2006.01)
*H01L 21/46* (2006.01)
(Continued)

(52) U.S. Cl.
CPC ...... *H01L 21/76254* (2013.01); *H01L 27/1266* (2013.01); *H01L 29/16* (2013.01); *H01L 29/78654* (2013.01)
USPC ........................................... 257/347; 438/458

(58) Field of Classification Search
CPC .................. H01L 21/76254; H01L 29/78654; H01L 29/16; H01L 27/1256; H01L 27/1266
USPC .......... 257/347, 625, 777, 635; 438/458, 455, 438/479, 407, 766
See application file for complete search history.

(56) References Cited

U.S. PATENT DOCUMENTS 6,995,075 B1 * 2/2006 Usenko .......................... 438/458
7,148,124 B1 * 12/2006 Usenko .......................... 438/458
(Continued)

FOREIGN PATENT DOCUMENTS

JP  2004-288780 A  10/2004
JP  2009-507363 A  2/2009
(Continued)

OTHER PUBLICATIONS

Official Communication issued in International Patent Application No. PCT/JP2012/066299, mailed on Sep. 25, 2012.

*Primary Examiner* — Nikolay Yushin
(74) *Attorney, Agent, or Firm* — Keating & Bennett, LLP

(57) ABSTRACT

Film thickness variations are prevented in a plurality of single crystal semiconductor films separated at a fragile layer reliably and transferred to a base substrate. A method for manufacturing a SOI substrate (33) in which a plurality of SOI layers (15) are disposed on a base substrate (30) includes the steps of bonding a plurality of SOI wafers (10), in which an oxide film (14), a SOI layer (15), a BOX layer (12), and a Si support substrate (13) having a fragile layer (17) formed by ion irradiation in the inside and being made from a single crystal semiconductor material are stacked sequentially, to a base substrate (30) in such a way that the oxide film (14) is located on the side close to the base substrate (30), applying heat to the plurality of SOI wafers (10) to separate part of the Si support substrate (13) at the fragile layer (17) and transfer the oxide film (14), the SOI layer (15), the BOX layer (12), and a single crystal Si layer (18) which is part of the Si support substrate (13) to the base substrate (30), and subjecting the base substrate (30) to an etch back treatment to expose the BOX layer (12) by etching the transferred single crystal Si layer (18).

19 Claims, 18 Drawing Sheets

(51) Int. Cl.
  *H01L 21/762* (2006.01)
  *H01L 29/16* (2006.01)
  *H01L 29/786* (2006.01)

(56) References Cited

U.S. PATENT DOCUMENTS

| | | | |
|---|---|---|---|
| 7,767,547 B2 * | 8/2010 | Isaka et al. | 438/458 |
| 7,795,111 B2 * | 9/2010 | Shimomura et al. | 438/455 |
| 2004/0183133 A1 | 9/2004 | Takafuji et al. | |
| 2007/0026638 A1 | 2/2007 | Henley | |
| 2007/0117354 A1 | 5/2007 | Gadkaree et al. | |
| 2009/0079024 A1 | 3/2009 | Yamazaki | |
| 2009/0081845 A1 | 3/2009 | Yamazaki et al. | |
| 2009/0181518 A1 | 7/2009 | Omata et al. | |
| 2010/0055872 A1 | 3/2010 | Moriwaka | |
| 2013/0221481 A1 | 8/2013 | Mitani | |

FOREIGN PATENT DOCUMENTS

| | | |
|---|---|---|
| JP | 2009-094488 A | 4/2009 |
| JP | 2009-094496 A | 4/2009 |
| JP | 2009-516929 A | 4/2009 |
| JP | 2009-194375 A | 8/2009 |
| JP | 2009-246346 A | 10/2009 |
| JP | 2010-080938 A | 4/2010 |

* cited by examiner (a)

(b)

(a)

(b)

(a)

(b)

(a)

(b)

(a)

(b)

METHOD FOR MANUFACTURING SEMICONDUCTOR SUBSTRATE, SUBSTRATE FOR FORMING SEMICONDUCTOR SUBSTRATE, STACKED SUBSTRATE, SEMICONDUCTOR SUBSTRATE, AND ELECTRONIC DEVICE

TECHNICAL FIELD

The present invention relates to a method for manufacturing a semiconductor substrate, a substrate for forming a semiconductor substrate, a stacked substrate, and an electronic device.

BACKGROUND ART

In order to increase the speed of driving and reduce power consumption, a method for forming an integrated circuit by using an SOI (Silicon On Insulator) wafer provided with a thin single crystal Si layer on an insulating layer in place of a bulk (silicon) wafer has been developed. It is known that a parasitic capacitance can be decreased by forming an integrated circuit by using the SOI wafer. Usually, the SOI wafer is produced by a Smart Cut (registered trade mark) process using hydrogen ion implantation.

However, such a common SOI wafer uses a Si wafer having a diameter of 6 to 8 inches and, therefore, it is difficult to upsize a screen.

Then, in recent years, as disclosed in PTLs 1 to 6, methods for producing large-area SOI substrates have been disclosed, wherein the Smart Cut process and the like are used, a plurality of Si wafers are bonded side by side to a large glass substrate, and a Si film is transferred.

In this manner, an inexpensive large-area SOI substrate can be produced by bonding a plurality of Si wafers to a large glass substrate and transferring a Si film.

According to PTLs 1 and 2, Si wafers are placed side by side on a tray provided with a plurality of concave portions, hydrogen ions are implanted into the wafers to form fragile layers (damaged regions) and, thereafter, bonding to a glass substrate in a collective manner is performed. Subsequently, the glass substrate with Si wafers bonded is subjected to a heat treatment to induce separation at the fragile layers, so that the plurality of Si films are transferred to the glass substrate. In this manner, a SOI substrate in which the plurality of Si films have been transferred to the glass substrate can be obtained.

Here, in the case where a thin film transistor (TFT) or the like is formed, a Si film having a small film thickness is necessary. However, if a fragile layer is formed at somewhat shallow depth and the Si film having a small film thickness is transferred directly to a glass substrate, a hole is made in the Si film easily and the yield is decreased.

Consequently, a Si film having a film thickness larger than a predetermined film thickness is transferred to the glass substrate in advance. Then, the transferred Si film is irradiated with laser light to planarize the surface of the Si film. Thereafter, a so-called etch back treatment is applied to all over the surface of the glass substrate with the transferred Si film to decrease the thickness of the transferred Si film.

In the etch back treatment, the glass substrate with the transferred Si film having a film thickness larger than the predetermined film thickness is put into a chamber, a process gas is introduced into the chamber, and a dry etching treatment to generate plasma on the surface of the glass substrate is performed.

However, if a large glass substrate is subjected to the etch back treatment, the transferred Si film does not become thin uniformly.

FIG. 16 (*a*) is a plan view of a conventional semiconductor substrate before an etch back treatment. FIG. 16 (*b*) is a sectional view of FIG. 16 (*a*).

FIG. 17 (*a*) is a plan view of a conventional semiconductor substrate after an etch back treatment. FIG. 17 (*b*) is a sectional view of FIG. 17 (*a*).

As shown in FIGS. 16 (*a*) and (*b*), in a SOI substrate 800, transferred six Si wafers 810 are disposed non-contiguously on a large glass substrate 801. The Si wafer 810 is composed of a single crystal Si film 811 and a thermal oxidation film 812. The single crystal Si film 811 is disposed on the glass substrate 801 with the thermal oxidation film 812 therebetween. As an example, one Si wafer 810 has six panel-forming regions 850.

When the single crystal Si films 811 of this SOI substrate 800 are subjected to the etch back treatment, as shown in FIGS. 17 (*a*) and (*b*), the single crystal Si films 811 in corner portions and a central portion of the SOI substrate 800 are etched slowly under the influence of the in-plane distribution of an etching apparatus and thick film portions 803 having large film thicknesses are formed.

On the other hand, the single crystal Si films 811 located in the vertical and horizontal directions in the drawing shown in FIG. 17 (*a*) are etched quickly and, as shown in FIGS. 17 (*a*) and (*b*), thin film portions 804 having small film thicknesses are formed.

This is because the dry etching apparatus (parallel plate type RIE or ICP type RIE) of the large glass substrate has an etching rate distribution inherent in the apparatus.

In general, as for a dry etching apparatus of a large glass substrate, in the peripheral portion (in particular, corner portions), an electric field escapes easily, discharge density decreases easily, and the flow rate of an etching gas fed from a shower plate decreases easily, and in the central portion as well, the etching gas do not remain easily, so that in these regions, the etching rates are small.

Consequently, the etching rates have a doughnut type distribution, although it becomes difficult to improve the distribution in itself of these etching rates as the glass substrate becomes large.

In the case where the single crystal Si films 811 transferred to the large glass substrate 801 are subjected to the etch back treatment on the basis of dry etching by using these apparatuses, the single crystal Si films 811 become thick in the corner portion in which the etching rates are small and the single crystal Si films 811 become thin in the upper, lower, left, and right regions in which the etching rates are large.

As a result, the film thicknesses of the single crystal Si films 811 exhibit variations in the shape of a doughnut. In particular, as for the single crystal Si films 811 in the corner portion of the SOI substrate 800, the thick film portions 803 and the thin film portions 804 are formed in one Si film and, thereby, the film thickness variations occur in one Si film.

If TFTs (thin film transistors) are formed using the single crystal Si films 811 having film thickness variations as described above, the threshold voltages of TFTs fluctuate and, thereby, it becomes difficult to form TFT backplanes, which are required to have uniform TFT characteristics, for organic EL display devices and the like.

Meanwhile, the area of the single crystal Si films 811 having a uniform film thickness decreases by the etching treatment, so that the area of the panel-forming regions 850, in which the single crystal Si films 811 having a uniform film thickness are obtained, also decreases. Consequently, the panel layout efficiency decreases. As a result, a problem occurs in that the panel cost increases.

Such a problem in that the single crystal Si films 811 exhibit film thickness variations in the shape of a doughnut is a problem which peculiarly considerably occurs in the case where the SOI substrate with a plurality of Si films transferred to a large glass substrate is subjected to dry etching. This issue is not a serious problem in the case where a small substrate, e.g., a Si wafer or a SOI wafer serving as a small substrate, a small glass substrate, or a small SOI substrate, in which small glass substrates are bonded together in a one-to-one correspondence, is subjected to dry etching.

PTL 7 discloses a method in which the film thicknesses of a plurality of Si films, which have been bonded to a glass substrate and have been separated at the fragile layer, are decreased by CMP (chemical mechanical polishing).

In PTL 7, in consideration of variations in the amount of in-plane polishing by CMP, a plurality of types of Si wafers in which the depths of fragile layers formed in the Si wafers from the surface are different, are bonded to a glass substrate and, thereby, Si films having different film thicknesses are transferred. According to PTL 7, in a region in which the amount of polishing by CMP (chemical mechanical polishing) is large (for example, in the peripheral portion of the glass substrate), Si wafers with large depths of the fragile layers from the surfaces (that is, the Si film thickness after the transfer is large) are disposed on the glass substrate, and in a region in which the amount of polishing by CMP is small (for example, in the central portion of the glass substrate), Si wafers with small depths of the fragile layers from the surfaces (that is, the Si film thickness after the transfer is small) are disposed on the glass substrate.

Consequently, variations between film thicknesses of the plurality of Si films due to the difference in the amount of polishing treatment by CMP are prevented.

In PTL 7, as shown in FIG. 18 (a), a so-called bulk Si wafer 900 composed of a single crystal Si substrate 901 and a thermal oxidation film 902 disposed on the single crystal Si substrate 901 is used as a Si wafer before being bonded to the glass substrate.

Ions are implanted into the single crystal Si substrate 901 of the Si wafer 900 from the surface side of the thermal oxidation film 902, so as to form a fragile layer 903 in the single crystal Si substrate 901. In this case, the depth of the fragile layer 903 is adjusted in accordance with the amount of polishing by CMP thereafter. Then, a plurality of Si wafers 900 in which the fragile layer 903 is disposed in the single crystal Si substrate 901 are bonded to the large glass substrate 904. In this case, in a region in which the amount of polishing by CMP is large (for example, in the peripheral portion of the glass substrate), Si wafers with large depths of the fragile layers from the surfaces (that is, the Si film thickness after the transfer is large) are disposed on the glass substrate, and in a region in which the amount of polishing by CMP is small (for example, in the central portion of the glass substrate), Si wafers with small depths of the fragile layers from the surfaces (that is, the Si film thickness after the transfer is small) are disposed on the glass substrate.

Next, as shown in FIG. 18 (b), heat is applied and, thereby, a single crystal Si layer 905 which is part of the single crystal Si substrate 901 is separated along the fragile layer 903, and the remaining film is obtained as a Si film 906 transferred to the glass substrate 904. The surface of the resulting Si film 906 is polished by CMP, so that the film thickness of the Si film 906 is decreased.

In PTL 8, a SOI wafer, in which a BOX (buried oxide) layer made from $SiO_2$ is disposed in the inside of the single crystal Si layer, is used and the SOI wafer provided with the fragile layer in the BOX layer rather than in a single crystal Si substrate is transferred to the glass substrate.

According to PTL 8, as shown in FIG. 19 (a), ions are implanted into the SOI wafer 910, in which a Si support substrate 911, the BOX layer 912, a SOI layer 913 formed from single crystal Si, and a thermal oxidation film 914 are stacked sequentially from the surface side of the thermal oxidation film 914, so that a fragile layer 915 is formed in the BOX layer 912.

Subsequently, as shown in FIG. 19 (b), the SOI wafer 910 provided with the fragile layer 915 in the BOX layer 912 is bonded to the glass substrate 904.

Then, the SOI wafer 910 bonded to the glass substrate 904 is separated at the fragile layer 915 in the BOX layer 912 by applying heat, and the thermal oxidation film 914, the SOI layer 913, and part of the BOX layer 912 are transferred to the glass substrate 904. Thereafter, the BOX layer 912 transferred to the glass substrate 904 is removed by wet etching. Consequently, the SOI layer 913 disposed between the BOX layer 912 removed and the thermal oxidation film 914 is exposed and the plurality of SOI layers 913 having a uniform film thickness can be transferred to the glass substrate 904.

According to the method of PTL 8, crystal defects formed in the layer because of formation of the fragile layer 915 are limited in the BOX layer 912 and are not formed in the SOI layer 913. Meanwhile, the BOX layer 912 remaining after separation at the fragile layer 915 is removed by wet etching and, thereby, the SOI layer 913 between the BOX layer 912 and the thermal oxidation film 914 is exposed, so that the SOI layer 913 having a uniform film thickness can be obtained.

CITATION LIST

Patent Literature

PTL 1: Japanese Unexamined Patent Application Publication No. 2009-94488 (published on Apr. 30, 2009)

PTL 2: Japanese Unexamined Patent Application Publication No. 2009-94496 (published on Apr. 30, 2009)

PTL 3: Japanese Unexamined Patent Application Publication No. 2009-194375 (published on Aug. 27, 2009)

PTL 4: Japanese Unexamined Patent Application Publication No. 2010-80938 (published on Apr. 8, 2010)

PTL 5: Japanese Unexamined Patent Application Publication (Translation of PCT application) No. 2009-507363 (published on Feb. 19, 2009)

PTL 6: Japanese Unexamined Patent Application Publication (Translation of PCT application) No. 2009-516929 (published on Apr. 23, 2009)

PTL 7: Japanese Unexamined Patent Application Publication No. 2009-246346 (published on Oct. 22, 2009)

PTL 8: Japanese Unexamined Patent Application Publication No. 2004-288780 (published on Oct. 14, 2004)

SUMMARY OF INVENTION

Technical Problem

However, as described above, film thickness variations of a silicon film generated because of the etch back treatment occur not only between Si films transferred to the glass substrates but also in one Si film. Consequently, even when the depths of formation of the fragile layers from the surfaces are differentiated between a plurality of Si wafers as described in PTL 7, film thickness variations which occur in one Si wafer transferred cannot be prevented.

Furthermore, in PTL 7, as shown in FIGS. 18 (*a*) and (*b*), the fragile layers 903 are disposed at different depths in the single crystal Si substrates 901 in accordance with the places of disposition in the glass substrate. After separation at the fragile layer 903, a predetermined thickness of the surface of the Si film 906 transferred to the glass substrate 904 is polished by CMP in order to remove crystal structural defects formed because of ion implantation. However, the amounts of polishing are different between the plurality of Si films 906. Therefore, in the case where the amount of polishing of the Si film is small (Si film resulting from transfer of Si wafer in which the depth of formation of the fragile layer is small), crystal structural defects formed in the Si film 906 cannot be removed completely, and crystal defects in the Si film 906 remain. Conversely, if the amount of polishing is increased in order to completely remove crystal defects of the Si film in which the depth of formation of the fragile layer is small (Si film with a small amount of polishing) by CMP, the film thickness of the Si film in which the depth of formation of the fragile layer is large (Si film with a large amount of polishing) is too decreased by CMP.

Meanwhile, the BOX layer is made from amorphous $SiO_2$, so that the crystal structure has been disordered sufficiently. Therefore, if hydrogen ions are implanted into the BOX layer, the fragile layer is not formed easily.

Consequently, according to the method in PTL 8, the fragile layer formed in the BOX layer is not separated easily in practice, and defective product is generated easily in separation at the fragile layer, for example, cracking for separation is stopped on the way and cracking occurs in a contorted direction.

The present invention has been made to solve the above-described problems and it is an object thereof to perform separation at a fragile layer reliably and prevent film thickness variations in a plurality of single crystal semiconductor films transferred to a base substrate.

Solution to Problem

In order to solve the above-described problems, a method for manufacturing a semiconductor substrate, according to the present invention, is a method for manufacturing a semiconductor substrate in which a plurality of single crystal semiconductor films are disposed on a base substrate and is characterized by including the steps of bonding a plurality of stacked substrates, in which a first insulating film, a single crystal semiconductor film, a second insulating film, and a support substrate having a fragile layer formed by ion irradiation in the inside and being made from a single crystal semiconductor material are stacked sequentially, to a base substrate in such a way that the above-described first insulating film is located on the side close to the above-described base substrate, applying heat to the above-described plurality of stacked substrates to separate part of the above-described support substrate at the above-described fragile layer and transfer the above-described first insulating film, the above-described single crystal semiconductor film, the above-described second insulating film, and part of the above-described support substrate to the above-described base substrate, and subjecting the above-described base substrate to an etch back treatment to expose the above-described second insulating film by etching part of the above-described transferred support substrate.

According to the above-described configuration, the above-described stacked substrate bonded to the above-described base substrate is provided with the fragile layer in the inside of the above-described support substrate made from a single crystal material. Consequently, it is possible that separation is performed at the above-described fragile layer reliably by applying heat and the single crystal semiconductor film, the above-described second insulating film, and part of the above-described support substrate are transferred to the above-described base substrate.

Then, the above-described second insulating film is disposed between the above-described single crystal semiconductor film transferred to the base substrate and the part of the above-described support substrate and, therefore, when the above-described base substrate is subjected to the etch back treatment to etch the part of the above-described transferred support substrate, the above-described second insulating film functions as an etch stopper, and etching of the above-described single crystal semiconductor film can be prevented.

Consequently, the semiconductor substrate in which film thickness variations of the plurality of single crystal semiconductor films disposed on the above-described base substrate are suppressed can be obtained.

In order to solve the above-described problems, a substrate for forming a semiconductor substrate, according to the present invention, is a substrate for forming a semiconductor substrate to form a semiconductor substrate in which a plurality of single crystal semiconductor films are disposed on a base substrate and is characterized in that a plurality of stacked substrates, in which a first insulating film, a single crystal semiconductor film, a second insulating film, and a support substrate having a fragile layer formed by ion irradiation in the inside and being made from a single crystal semiconductor material are stacked sequentially, are bonded to a base substrate in such a way that the above-described first insulating film is located on the side close to the above-described base substrate, and the film thickness of the above-described second insulating film in the above-described stacked substrate is less than or equal to one-third the sum of the film thicknesses of the above-described first insulating film and the above-described single crystal semiconductor film.

In order to solve the above-described problems, a stacked substrate, according to the present invention, is a stacked substrate to be bonded to a base substrate for forming a semiconductor substrate in which a plurality of single crystal semiconductor films are disposed on the above-described base substrate and is characterized in that a first insulating film, a single crystal semiconductor film, a second insulating film, and a support substrate having a fragile layer formed by ion irradiation in the inside and being made from a single crystal semiconductor material are stacked sequentially, and the film thickness of the above-described second insulating film is less than or equal to one-third the sum of the film thicknesses of the above-described first insulating film and the above-described single crystal semiconductor film.

According to the above-described configuration, the above-described stacked substrate bonded to the above-described base substrate is provided with the fragile layer in the above-described support substrate made from a single crystal material. Consequently, it is possible that separation is performed at the above-described fragile layer reliably by applying heat and the single crystal semiconductor film, the above-described second insulating film, and part of the above-described support substrate are transferred to the above-described base substrate.

Then, the above-described second insulating film is disposed between the above-described single crystal semiconductor film transferred to the base substrate and the part of the above-described support substrate and, therefore, when the above-described base substrate is subjected to the etch back treatment to etch the part of the above-described transferred support substrate, the above-described second insulating film functions as an etch stopper, and etching of the above-described single crystal semiconductor film can be prevented.

Consequently, the semiconductor substrate in which film thickness variations of the plurality of single crystal semiconductor films disposed on the above-described base substrate are suppressed can be obtained.

In addition, the film thickness of the above-described second insulating film in the above-described stacked substrate is less than or equal to one-third the sum of the film thicknesses of the above-described first insulating film and the above-described single crystal semiconductor film and, therefore, the film thickness of the above-described second insulating film is small. Consequently, even when the above-described second insulating film is disposed between the above-described single crystal semiconductor film and the above-described support substrate, the above-described fragile layer can be formed in the inside of the above-described support substrate reliably.

Advantageous Effects of Invention

The method for manufacturing a semiconductor substrate, according to the present invention, is a method for manufacturing a semiconductor substrate in which a plurality of single crystal semiconductor films are disposed on a base substrate, and includes the steps of bonding a plurality of stacked substrates, in which a first insulating film, a single crystal semiconductor film, a second insulating film, and a support substrate having a fragile layer formed by ion irradiation in the inside and being made from a single crystal semiconductor material are stacked sequentially, to a base substrate in such a way that the above-described first insulating film is located on the side close to the above-described base substrate, applying heat to the above-described plurality of stacked substrates to separate part of the above-described support substrate at the above-described fragile layer and transfer the above-described first insulating film, the above-described single crystal semiconductor film, the above-described second insulating film, and part of the above-described support substrate to the above-described base substrate, and subjecting the above-described base substrate to an etch back treatment to expose the above-described second insulating film by etching part of the above-described transferred support substrate.

The substrate for forming a semiconductor substrate, according to the present invention, is a substrate for forming a semiconductor substrate to form a semiconductor substrate in which a plurality of single crystal semiconductor films are disposed on a base substrate and is characterized in that a plurality of stacked substrates, in which a first insulating film, a single crystal semiconductor film, a second insulating film, and a support substrate having a fragile layer formed by ion irradiation in the inside and being made from a single crystal semiconductor material are stacked sequentially, are bonded to a base substrate in such a way that the above-described first insulating film is located on the side close to the above-described base substrate, and the film thickness of the above-described second insulating film in the above-described stacked substrate is less than or equal to one-third the sum of the film thicknesses of the above-described first insulating film and the above-described single crystal semiconductor film.

The stacked substrate, according to the present invention, is a stacked substrate to be bonded to a base substrate for forming a semiconductor substrate in which a plurality of single crystal semiconductor films are disposed on the above-described base substrate, and is characterized in that a first insulating film, a single crystal semiconductor film, a second insulating film, and a support substrate having a fragile layer formed by ion irradiation in the inside and being made from a single crystal semiconductor material are stacked sequentially, and the film thickness of the above-described second insulating film is less than or equal to one-third the sum of the film thicknesses of the above-described first insulating film and the above-described single crystal semiconductor film.

Consequently, effects of performing separation at the fragile layer reliably and preventing film thickness variations in the plurality of single crystal semiconductor films transferred to the base substrate.

DESCRIPTION OF EMBODIMENTS

[First Embodiment]

A first embodiment according to the present invention will be described.

(Outline of Method for Manufacturing SOI Substrate 32)

Figure 1:
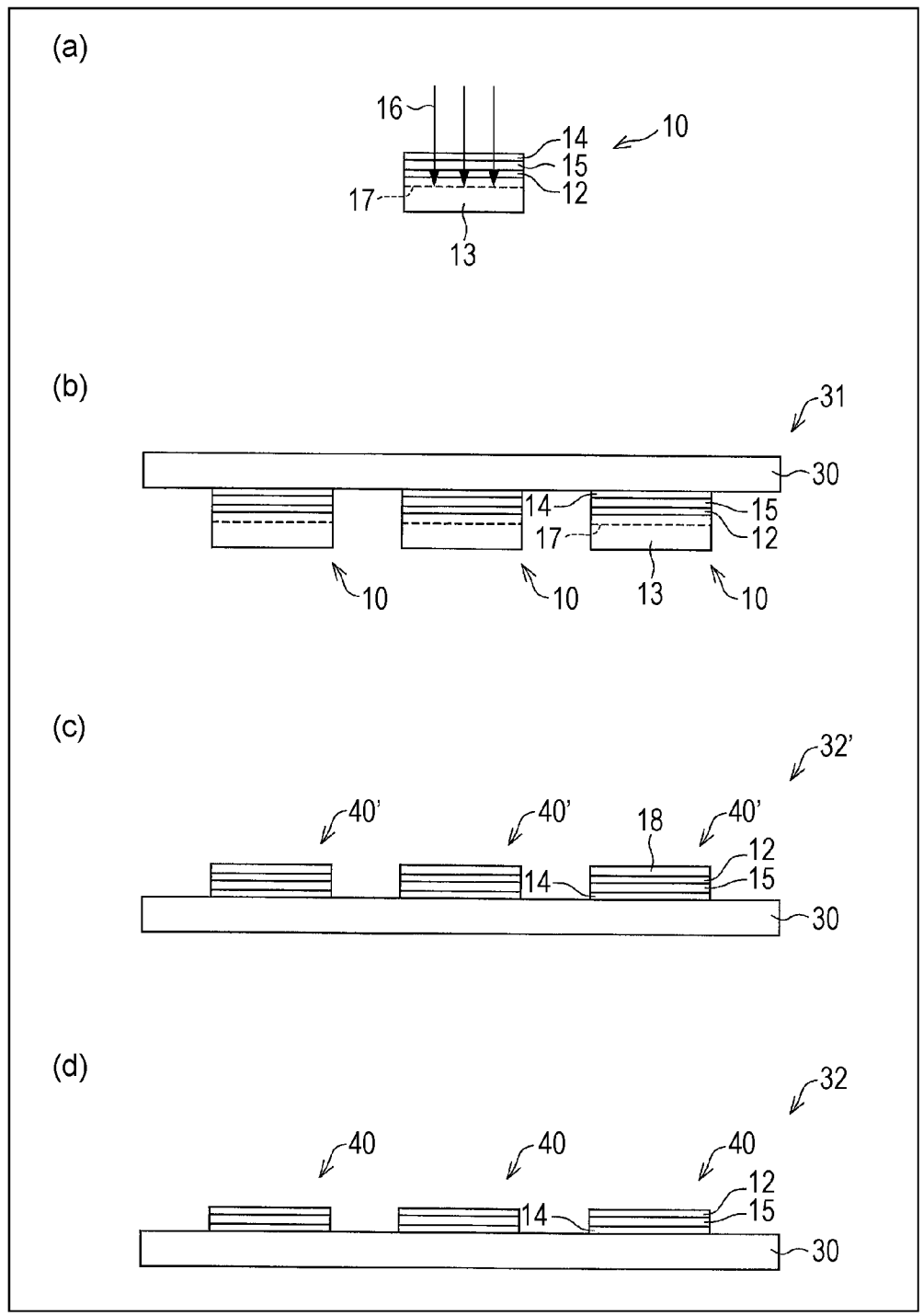
FIG. 1 is a diagram illustrating the outline of a method for manufacturing a SOI substrate according to a first embodiment of the present invention.

To begin with, the outline of a method for manufacturing a SOI substrate 32 according to the present embodiment will be described with reference to FIG. 1 (a) to (d) and FIGS. 2 (a) and (b). FIG. 1 is a diagram illustrating the outline of the method for manufacturing the SOI substrate 32 according to the present invention.

Initially, as shown in FIG. 1 (a), a SOI wafer (stacked substrate) 10 is prepared. The SOI wafer 10 is a substrate to be bonded to a base substrate for forming a SOI substrate (semiconductor substrate) in which a plurality of single crystal semiconductor films are disposed on the above-described base substrate.

The SOI wafer 10 is formed from an oxide film (first insulating film) 14 made from $SiO_2$, a SOI layer (single crystal semiconductor film) 15 formed from single crystal Si, a BOX layer (second insulating film) 12 made from $SiO_2$, and a Si support substrate (support substrate) 13 made from single crystal Si, which are stacked sequentially. When a TFT or the like is formed, the SOI layer 15 serves as an active layer. Therefore, the SOI layer 15 is a film required to have, in particular, a uniform film thickness after being transferred to the base substrate. In this regard, the SOI wafer 10 will be described later in detail.

Hydrogen ions (ions 16) are applied (ion implantation or ion doping) from the surface side of this oxide film 14 and, thereby, a fragile layer (crystal defect layer) 17 is formed at a predetermined depth of the inside of the Si support substrate (support substrate) 13. A plurality of the SOI wafers 10 are prepared.

As shown in FIG. 1 (b), each of the plurality of SOI wafers 10 and a base substrate 30 is subjected to a surface treatment to make the surface hydrophilic and the surface side of the oxide films 14 of the plurality of SOI wafers 10 are bonded to the base substrate 30 formed from large glass or the like. Consequently, a bonded substrate (substrate for forming semiconductor substrate) 31 in which the surface of the oxide film 14 of each of the plurality of SOI wafers 10 is bonded to the base substrate 30 can be obtained.

Subsequently, the plurality of SOI wafers 10 are heated and, thereby, part of the Si support substrate 13 is separated at the fragile layer 17. In this manner, as shown in FIG. 1 (c), a bonded substrate 32' can be obtained, where a plurality of SOI wafers 40' formed from the oxide film 14, the SOI layer 15, the BOX layer 12, and single crystal Si layer 18 which is part of the Si support substrate 13 and which is separated at the fragile layer 17 are bonded to the base substrate 30. The bonded substrate 32' is a SOI substrate before the etch back treatment.

In the SOI wafer 10, the fragile layer 17 is disposed not in the amorphous BOX layer 12, but in the Si support substrate 13 made from single crystal Si. Consequently, part of the Si support substrate 13 can be separated at the fragile layer 17 reliably by applying heat.

Then, the base substrate 30 with the plurality of SOI wafers 40' transferred, that is, bonded substrate 32', is subjected to the etch back treatment, so that the single crystal Si layers 18 of the SOI wafers 40' are etched and the BOX layers 12 are exposed.

In this manner, as shown in FIG. 1 (d), a SOI substrate (semiconductor substrate) 32 in which a plurality of SOI wafers 40 formed from the oxide film 14, the SOI layer 15, and the BOX layer 12 are transferred to the base substrate 30 can be obtained. The SOI substrate 32 is a substrate after the etch back treatment.

As described above, the BOX layer 12 is disposed between the SOI layer 15 and the single crystal Si layer 18 transferred to the base substrate 30 before the etch back treatment and, therefore, the BOX layer 12 is allowed to function as an etch stopper when the base substrate 30 is subjected to the etch back treatment to etch the single crystal Si layer 18. Consequently, etching of the SOI layer 15 under the BOX layer 12 can be prevented in the etch back treatment.

In the present embodiment, as described later, the SOI substrate 32 is subjected to wet etching to remove the BOX layer 12 and expose the SOI layer 15 under the BOX layer 12.

According to the method for manufacturing the SOI substrate 32, as described above, the SOI substrate 32 can be obtained while film thickness variations between the plurality of SOI layers 15 disposed on the base substrate 30 and in one SOI layer 15 are suppressed.

Figure 2:
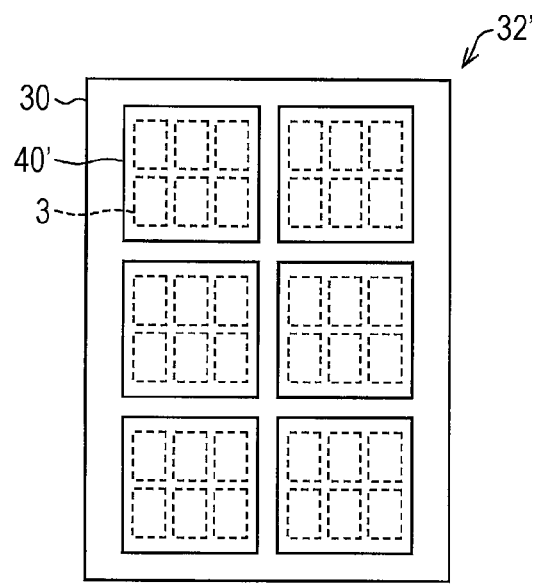
FIG. 2 is a plan view showing a SOI substrate, (a) shows the SOI substrate before an etch back treatment, and (b) shows the SOI substrate after the etch back treatment.
Figure 2:
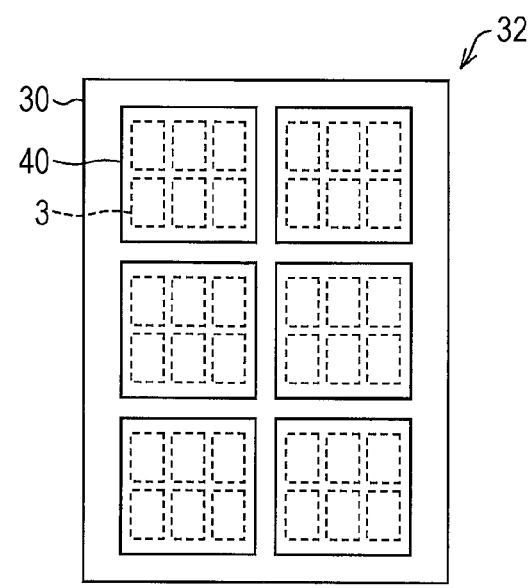

FIG. 2 (a) is a plan view showing the SOI substrate before the etch back treatment, and FIG. 2 (b) is a plan view showing the SOI substrate after the etch back treatment.

For example, in the case where the bonded substrate 32' has six panel-forming regions 3 in one SOI wafer 40' before the etch back treatment, as shown in FIG. 2 (a), the SOI substrate 32 can have six panel-forming regions 3 to form panels having a uniform film thickness in one SOI wafer 40 after the etch back treatment, as shown in FIG. 2 (b).

As described above, the SOI substrate 32 includes a plurality of SOI layers 15 having a uniform film thickness in the SOI substrate 32 after the etch back treatment as well. Therefore, TFT backplanes having an even threshold voltage can be formed and, in addition, an area in which panels can be formed (that is, area of SOI layers 15 having a uniform film thickness) can be ensured sufficiently. Consequently, an improvement in the panel acquisition efficiency and cost reduction can be realized.

(Detailed Explanation of SOI Wafer 10)

Next, the SOI wafer 10 will be explained in detail with reference to FIG. 1 (a), FIG. 3, and FIG. 4.

As shown in FIG. 1 (a), in the SOI wafer 10, the oxide film 14, the SOI layer 15, the BOX layer 12, and the Si support substrate 13 are stacked sequentially.

As described above, the base substrate 30 which is a counterpart of the SOI wafer 10 in bonding is bonded to the surface of the oxide film 14.

In order to perform good transfer, the film thickness of the oxide film 14 is preferably about 10 nm to 200 nm. In the case where the film thickness of the oxide film 14 is specified to be about 10 nm to 200 nm, an occurrence of pinhole defect, e.g., a blister, during the heat treatment for the transfer can be prevented. On the other hand, if the film thickness of the oxide film 14 is small, contamination (diffusion) due to impurity elements from the base substrate which is a counterpart in bonding is feared. In the present example, the film thickness of the oxide film 14 is specified to be about 100 nm, as an example, in consideration of prevention of contamination (diffusion) due to impurity elements from the base substrate, which is a counterpart in bonding, as well.

In the present embodiment, the oxide film 14 is specified to be made from SiO$_2$ obtained by thermal oxidation of single crystal Si. However, the oxide film 14 is not limited to SiO$_2$, and nitride films, e.g., SiON (silicon oxynitride), SiNO (silicon nitride oxide), or SiNx (silicon nitride), which have a high impurity barrier property may be used. Contamination (diffusion) due to impurity elements from the base substrate which is a counterpart in bonding can be prevented effectively by using SiON (silicon oxynitride), SiNO (silicon nitride oxide), or SiNx (silicon nitride) for the oxide film 14.

The SOI layer 15 is a film functioning as an active layer after being bonded to the base substrate 30.

For example, in the case where a TFT for a liquid crystal panel is produced, if the film thickness of the SOI layer 15 is too small, the on current decreases and the driving force becomes short. On the other hand, if the film thickness of the SOI layer 15 is too large, an optical leakage current increases.

Therefore, the film thickness of the SOI layer 15 is specified to be preferably 50 nm or more and 200 nm or less. Consequently, a TFT which can pass the on current capable of obtaining the driving force sufficiently and in which an occurrence of an optical leakage current is suppressed. That is, a SOI substrate having a film thickness suitable for a TFT to be applied to liquid crystal displays, organic EL displays, and the like can be obtained.

The SOI layer 15 is a film made from a single crystal semiconductor material and is specified to be made from single crystal Si in the present embodiment. However, the single crystal semiconductor material is not limited to Si, and Ge (germanium), semiconductor materials containing Si and Ge, III-V group compound semiconductors, e.g., Si compounds, GaAs, and GaN, and the like may be used in place of Si.

The BOX layer 12 is a buried oxide film formed by being buried between the SOI layer 15 made from single crystal Si and the Si support substrate 13.

In the present embodiment, the BOX layer 12 is a film allowed to function as an etch stopper when etching is performed to expose the SOI layer 15 after bonding to the base substrate 30. Therefore, the BOX layer 12 is preferably made from a material having a selection ratio of 2 or more relative to the material constituting the support substrate 13 in the etch back treatment.

The BOX layer 12 is formed in such a way that the film thickness becomes small as compared with that of a BOX layer formed in a common SOI wafer which is used alone without being bonded to the base substrate 30.

Figure 3:
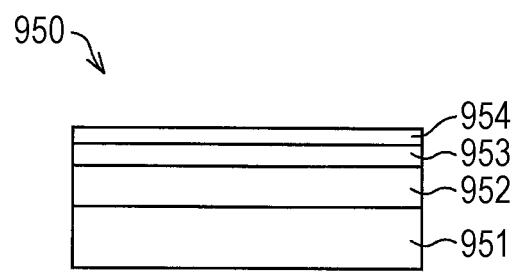
FIG. 3 is a sectional view showing the configuration of a common SOI wafer.

FIG. 3 is a sectional view showing the configuration of a common SOI wafer.

In a SOI wafer 950 shown in FIG. 3, an oxide film 954 made from SiO$_2$, a SOI layer 953 made from single crystal Si, a BOX layer 952 made from SiO$_2$, and a Si support substrate 951 made from single crystal Si are stacked sequentially.

The SOI wafer 950 is not bonded to a base substrate or the like, and is used alone to produce a TFT and the like. The BOX layer 952 is a buried oxide layer formed by being buried between the SOI layer 953 made from single crystal Si and the Si support substrate 951.

When a TFT is formed on the SOI wafer 950, the BOX layer 952 of the SOI wafer 950 not bonded to the base substrate is usually used as an insulating layer to suppress the parasitic capacitance of the source•drain and a leakage current (leak current). Therefore, the BOX layer 952 is formed having a relatively large film thickness in such a way that the film thickness becomes about 0.1 μm or more and 20 μm or less in general.

That is, if the film thickness of the BOX layer 952 of the common SOI wafer 950 is decreased, it becomes difficult to suppress the parasitic capacitance of the source•drain and a leakage current (leak current), which is the essential purpose of the SOI wafer.

On the other hand, it is enough that the SOI wafer 10 shown in FIG. 1 (a) functions as an etch stopper in performing etching to expose the SOI layer 15 after being bonded to the base substrate 30. Therefore, in contrast to the Box layer 952 of the SOI wafer 950, a large film thickness of 0.1 μm or more is unnecessary. Consequently, the film thickness of the BOX layer 12 can be decreased.

In addition, it is necessary that the fragile layer 17 be formed in the inside of the Si support substrate 13 in the SOI wafer 10 by implanting hydrogen ions at a predetermined depth in the inside of the Si support substrate 13 from the surface side of the oxide film 14 through the oxide film 14, the SOI layer 15, and the BOX layer 12.

For this purpose, the BOX layer 12 is formed in such a way that the film thickness becomes 50 nm or less and, therefore, becomes small as compared with the film thickness of the BOX layer 952 of the common SOI wafer 952. Consequently, it is possible that the film thickness of the oxide film 14 is specified to be 100 nm, the film thickness of the SOI layer 15 is specified to be 50 nm or more and 200 nm or less, and hydrogen ions 16 are implanted from the surface side of the oxide film 14 to form the fragile layer 17 serving as a peeling surface in the inside of the Si support substrate 13. That is, the etch stopper can be formed.

As described above, the film thickness of the BOX layer 12 is a small 50 nm or less, so that the fragile layer 17 can be formed in the inside of the Si support substrate 13 reliably.

The Si support substrate (support substrate) 13 is a substrate serving as a handle wafer (handle layer) of the SOI wafer 10. The fragile layer 17 is disposed at a predetermined depth in the inside of the Si support substrate (support substrate) 13.

The Si support substrate 13 is made from a single crystal semiconductor material and is specified to be made from single crystal Si in the present embodiment. However, the single crystal semiconductor material is not limited to Si, and Ge (germanium), semiconductor materials containing Si and Ge, III-V group compound semiconductors, e.g., Si compounds, GaAs, and GaN, and the like may be used in place of Si. The film thickness of the Si support substrate 13 is specified to be about 635 μm, as an example.

As described above, the fragile layer 17 is formed in the inside of the Si support substrate 13 by implanting hydrogen ions 16 from the surface side of the oxide film 14 of the SOI wafer 10 into the Si support substrate 13.

As for hydrogen ion 16, H$^+$, a H$_2^+$ ion, or H$_3^+$ can be used. Also, a He ion may be implanted together with the H ion.

The depth of formation of the fragile layer 17 due to the hydrogen ions 16 from the surface of the oxide film 14 is determined by the implantation energy (acceleration voltage) of the hydrogen ion 16.

Figure 4:
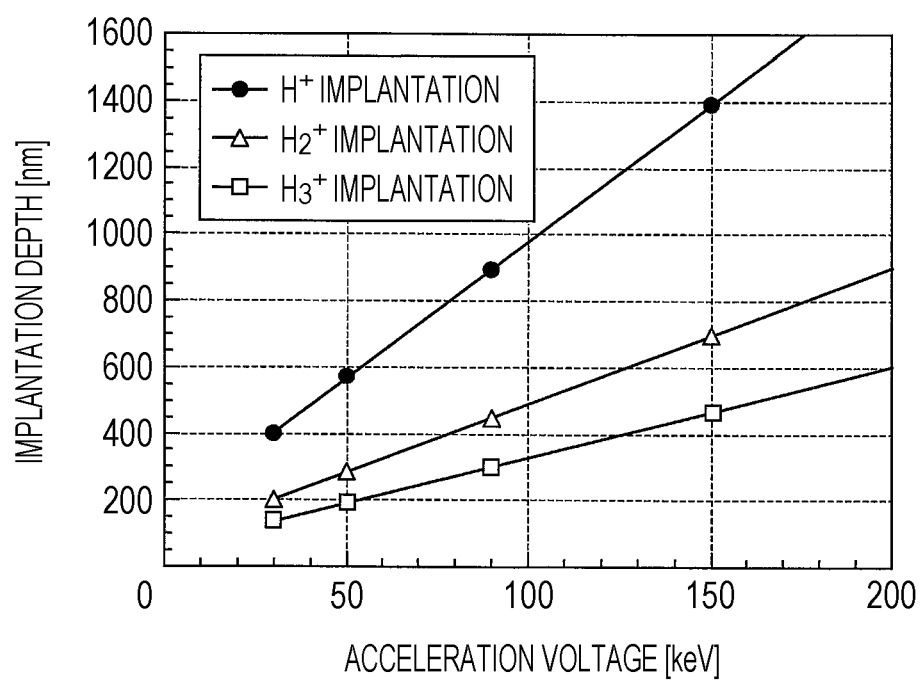
FIG. 4 is a diagram showing the implantation depths of $H^+$, $H_2^+$, and $H_3^+$ versus the acceleration voltage.

FIG. 4 is a diagram showing the implantation depths of H$^+$, H$_2^+$, and H$_3^+$ versus the acceleration voltage. The implantation depths of H$_2^+$ and H$_3^+$ are calculated on the basis of the implantation depth of H$^+$. That is, in the case where the acceleration voltage is constant, the implantation depth decreases as the ion becomes heavy, so that when H$_2^+$ and H$_3^+$ are used, the implantation depths are about one-half and about one-third, respectively, the depth of the H$^+$. As shown in FIG. 4, the implantation depth of the hydrogen ion 16 into the SOI wafer 10 exhibits acceleration voltage dependence.

As is clear from FIG. 4, the implantation depths of $H^+$, $H_2^+$, and $H_3^+$ increase as the acceleration voltage increases. However, if the acceleration voltage is too high, problems occur in that, for example, the throughput decreases and the temperature of the SOI wafer 10 underwent implantation becomes high. Consequently, in the case where the hydrogen ion 16 is implanted, the upper limit of the acceleration voltage is about 150 keV.

Therefore, the upper limit of the depth of implantation of the hydrogen ion 16 into the SOI wafer 10 without decreasing the production efficiency is about 1,400 nm in the case where $H^+$ is used as the hydrogen ion 16, about 700 nm when $H_2^+$ is used, and about 460 nm when $H_3^+$ is used.

Here, the common SOI wafer 950 shown in FIG. 3 includes the BOX layer 952 having a large film thickness of 0.2 μm or more and 5 μm or less.

In the case where the film thickness of the oxide film 954 of the SOI wafer 950 is specified to be 100 nm and the film thickness of the SOI layer 953 is specified to be 200 nm, the sum of the film thicknesses of the oxide film 954, the SOI layer 953, and the Box layer 952 becomes 500 nm or more and 5,300 nm or less. Consequently, even when $H^+$, $H_2^+$, or $H_3^+$ is implanted into the SOI wafer 950, it is not possible to form a fragile layer in the Si support substrate 951 disposed under the BOX layer 952.

On the other hand, the SOI wafer 10 according to the present embodiment includes the BOX layer 12 having a small film thickness of 50 nm or less. In the case where the film thickness of the oxide film 14 of the SOI wafer 10 is specified to be 100 nm and the film thickness of the SOI layer 15 is specified to be 200 nm, the sum of the film thicknesses of the oxide film 14, the SOI layer 15, and the Box layer 12 becomes 350 nm or less.

It is believed that the region in which the crystal structure is collapsed by implantation of hydrogen ions 16 and crystal defects and damage are included is approximately within the projection dispersion ($\Delta Rp \approx 100$ nm) from a peak of implantation (Rp). Therefore, even when this projection dispersion is taken into consideration, the implantation depth required for forming the fragile layer in the support substrate is 350 nm+100 nm=450 nm. Consequently, even when $H^+$ (implantation depth: about 1,400 nm), $H_2^+$ (implantation depth: about 700 nm), or $H_3^+$ (implantation depth: about 460 nm) is implanted into the SOI wafer 10, it is possible to form the fragile layer 17 in the Si support substrate 13 disposed under the BOX layer 12 reliably without damaging the SOI layer 15.

For the above-described reasons, the BOX layer 12 in the SOI wafer 10 is formed having a small thickness.

Specifically, in the SOI wafer 10, the film thickness of the oxide film 14 is about 100 nm and the film thickness of the SOI layer 15 is 50 nm or more and 200 nm or less, while the film thickness of the BOX layer 12 is less than 50 nm or less. That is, the film thickness of the BOX layer 12 is less than or equal to one-third the sum of the film thicknesses of the oxide film 14 and the SOI layer 15.

As described above, in the SOI wafer 10, the film thickness of the BOX layer 12 is small, so that, when hydrogen ions 16 are implanted from the oxide film 14 side, the hydrogen ions 16 pass through the oxide film 14, the SOI layer 15, and the BOX layer 12 and the fragile layer 17 can be formed in the inside of the Si support substrate 13.

Put another way, according to the configuration of the SOI wafer 10, the fragile layer 17 can be formed in the inside of the Si support substrate 13, even when the BOX layer 12 is disposed between the SOI layer 15 and the Si support substrate 13.

Meanwhile, the sum of the film thicknesses of the oxide film 14, the SOI layer 15, and the BOX layer 12 is preferably 350 nm or less. Consequently, even in the case where $H_3^+$ is implanted and the implantation depth is the smallest, defects are not generated in the BOX layer 12 and the SOI layer 15 and a good-quality SOI layer 15 can be transferred to a base substrate, even when the projection dispersion, in which it is believed that defects in implantation of hydrogen ions remain, is taken into consideration. Furthermore, in the case where any hydrogen atom is applied, the distance from the surface of the oxide film 14 to the Si support substrate 13 is small, and it is possible that the implantation depth of the hydrogen ions 16 (depth of the fragile layer 17 formed) is specified to be small. Consequently, the acceleration voltage can be decreased in ion implantation. The fragile layer 17 can be formed in the inside of the SOI wafer 10, while the temperature of the ion-implanted SOI wafer 10 is suppressed from becoming high and ions are implanted in a treatment time of such an extent that the throughput does not decrease, by decreasing this acceleration voltage. Therefore, a SOI substrate 33 suitable for mass production can be obtained.

(Specific Example of Method for Manufacturing Semiconductor Substrate)

Next, a specific example of a method for manufacturing a large SOI substrate 32 formed using the SOI wafer 10 will be described sequentially.

<<SOI Wafer Forming Step>>

Figure 5:
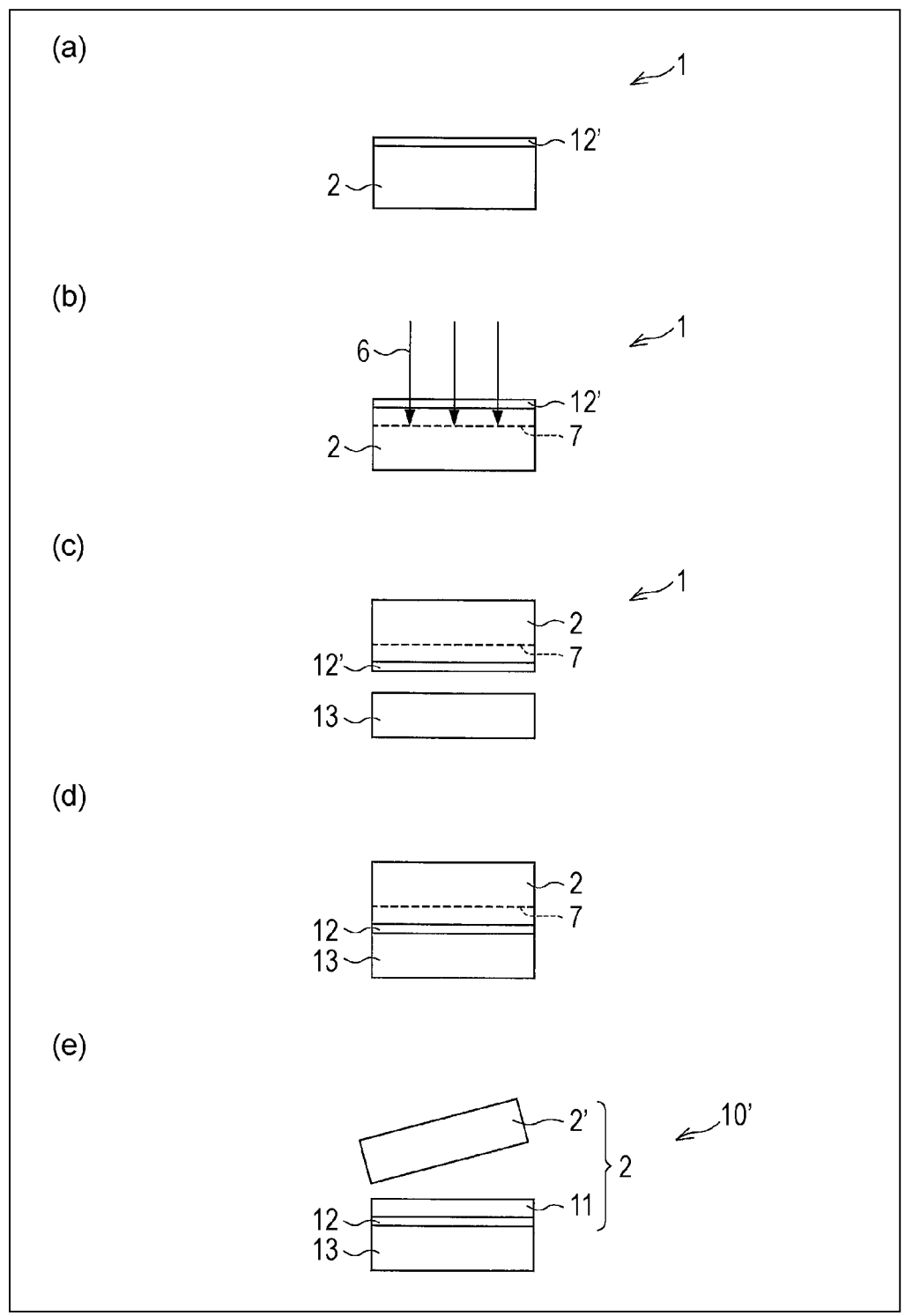
FIG. 5 is a diagram showing a method for manufacturing a SOI wafer.

Initially, a method for manufacturing a SOI wafer 10' to obtain the SOI wafer 10 will be described with reference to FIG. 5 (a) to (e). FIG. 5 (a) to (e) are diagrams showing the method for manufacturing the SOI wafer 10'.

As shown in FIG. 5 (a), in a step to form a thermal oxidation film, a Si wafer made from single crystal Si is subjected to a thermal oxidation treatment and, thereby, a thermal oxidation film ($SiO_2$) 12' is formed on the surface of a single crystal Si layer 2. In this manner, a Si wafer 1 in which the thermal oxidation film 12' is disposed on the surface of the single crystal Si layer 2 is obtained.

In the present embodiment, the film thickness of the thermal oxidation film 12' is specified to be 50 nm or less. The resulting thermal oxidation film 12' serves as a BOX layer 12 thereafter.

Subsequently, as shown in FIG. 5 (b), in a step to form a fragile layer, hydrogen ions 6 are implanted at a predetermined depth in the single crystal Si layer 2 of the Si wafer 1 by applying hydrogen ions 6 from the surface side of the thermal oxidation film 12' through ion implantation associated with mass segregation or ion doping not associated with mass segregation. In this manner, a fragile layer 7 is formed in the single crystal Si layer 2. As described later, it is necessary that a SOI layer 11 be transferred having somewhat large film thickness in advance because the transferred SOI layer 11 is cut by CMP after transfer or is made thin by thermal oxidation (sacrificial oxidation). Therefore, it is necessary that the implantation depth of the hydrogen ion 6 is set to be somewhat large in consideration of them.

As for the application condition of the hydrogen ion 6, for example, in the case where mainly $H^+$ or $H_2^+$ is ion-implanted (or ion doping), the implantation energy (acceleration voltage) is 10 keV or more and 90 keV or less and the amount of implantation is $1 \times 10^{16}/cm^2$ or more and $1 \times 10^{17}/cm^2$ or less.

On the other hand, in the case where mainly $H_3^+$ is ion-implanted (or ion doping), the implantation energy (acceleration voltage) is 35 keV or more and 150 keV or less and the amount of implantation is $1 \times 10^{16}/cm^2$ or more and $1 \times 10^{17}/cm^2$ or less. In this regard, a He ion may be implanted together with the H ion.

Then, as shown in FIG. 5 (c), in a step to perform a surface treatment, the surface of the thermal oxidation film 12' of the Si wafer 1, in which hydrogen ions 6 have been implanted, and the surface of the Si support substrate 13, which serves as a handle wafer and which is made of single crystal Si, are subjected to a plasma treatment or a chemical solution treatment. In this manner, the surface of the thermal oxidation film 12' and the surface of the Si support substrate 13 are allowed to become hydrophilic (hydrophilizing treatment).

As for the plasma treatment, Ar plasma, atmospheric pressure plasma, and the like can be used. Alternatively, the hydrophilizing treatment may be applied by performing the chemical solution treatment, e.g., ozone water washing or SC1 washing, for about several minutes.

Subsequently, the surfaces of the Si wafer 1 subjected to the hydrophilizing treatment and the Si support substrate 13 are faced each other.

Then, as shown in FIG. 5 (d), in a bonding step, the surfaces of the thermal oxidation film 12' of the Si wafer 1 and the Si support substrate 13 which have been subjected to the hydrophilizing treatment are bonded to each other. Each of the surfaces has been subjected to the hydrophilizing treatment and, therefore, when they are bonded to each other, the surfaces are joined together by the Van der Waals force.

Thereafter, a preannealing treatment at about 200° C. for about 2 h (time) is applied and, thereby, a dehydration reaction proceeds and a covalent bond is formed, so that the joining of the Si wafer 1 and the Si support substrate 13 can be made stronger.

In this manner, the BOX layer 12 which is disposed between the single crystal Si layer 2 and the Si support substrate 13 formed from single crystal Si layer and which has a small film thickness of 50 nm or less can be obtained.

Subsequently, as shown in FIG. 5 (e), in a step to transfer the single crystal Si to a support substrate, initially, the substrate formed by bonding the Si wafer 1 and the Si support substrate 13 is heat-treated at about 500° C. or higher and 700° C. or lower. Consequently, fine voids formed in the fragile layer 7 of the single crystal Si layer 2 are expanded to generate cracks and as a result, a single crystal Si layer 2' which is part of the single crystal Si layer 2 is separated along the fragile layer 7.

Then, the surface of the single crystal Si layer remaining after the single crystal Si layer 2' in the single crystal Si layer 2 is separated is polished by CMP, so that a transferred SOI layer 11 is obtained.

In this manner, a SOI wafer 10' can be obtained, wherein the BOX layer 12 and the SOI layer 11 stacked on the BOX layer 12 are transferred to the Si support substrate 13.

In the SOI wafer 10', the BOX layer 12 which is disposed between the SOI layer 11 made from single crystal Si and the Si support substrate 13 and which has a small film thickness of 50 nm or less is disposed.

As described above, in the common SOI wafer, the BOX layer disposed in the single crystal silicon has a film thickness of about 0.1 μm or more and 20 μm or less and, therefore, is formed having a large film thickness. Consequently, even when the implantation energy of the hydrogen ion applied from the SOI layer side is increased, it is difficult that the thick BOX layer is passed through and a fragile layer is formed in the Si support substrate.

On the other hand, in the SOI wafer 10', the film thickness of the BOX layer 12 is a small 50 nm or less. Therefore, as described above, hydrogen ions are applied from the SOI layer 11 side and are allowed to pass through the BOX layer 12, so that the Si support substrate 13 can be doped with the hydrogen ion at a position deeper than the BOX layer 12. In this manner, the fragile layer can be formed in the Si support substrate 13.

(Step Before Bonding of SOI Wafer to Insulating Substrate)

Next, each of steps before bonding of a SOI wafer to an insulating substrate will be described with reference to FIG. 6 (a) to (e).

Figure 6:
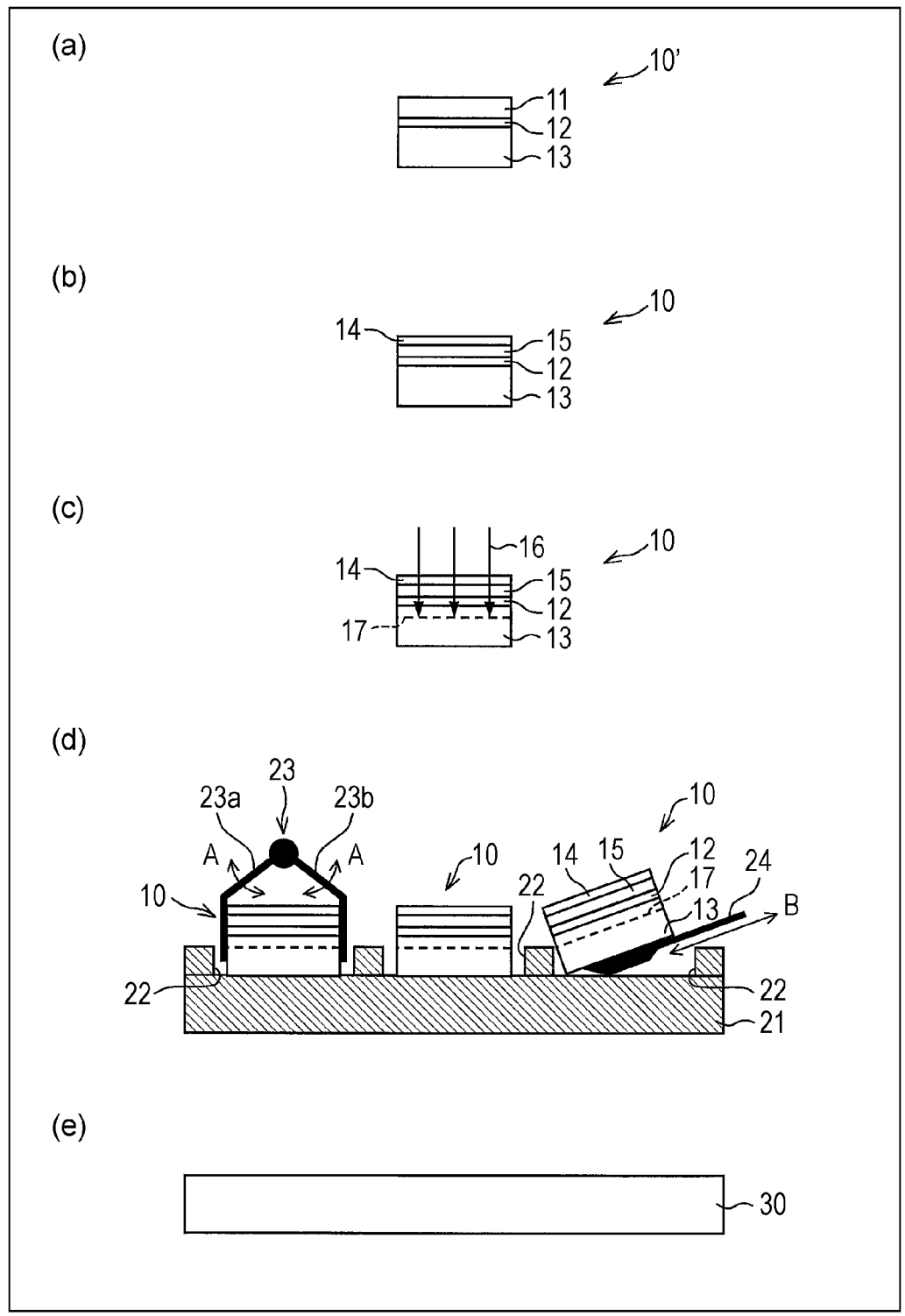
FIG. 6 is a diagram illustrating production steps of a SOI wafer and an insulating substrate and a step to place the SOI wafer on a tray.

FIG. 6 (a) to (e) are diagrams illustrating a production step of the SOI wafer and the insulating substrate and a step to place the SOI wafer on a tray.

Initially, as shown in FIG. 6 (a), the SOI wafer 10' is prepared, which is produced by the method explained with reference to FIG. 5 (a) to (e), as an example, and in which the BOX layer 12 having a small film thickness of 50 nm or less is disposed in the single crystal silicon.

Subsequently, as shown in FIG. 6 (b), in a step to form an oxide film, the SOI wafer 10' is heated and, thereby, is subjected to a thermal oxidation (sacrificial oxidation) treatment. The surface of the SOI wafer 10' is oxidized, as described above, so that the SOI wafer 10 including the oxide film 14 obtained from SOI layer 11 and converted to $SiO_2$ and the SOI layer 15, which is under the oxide film 14 and which is made from single crystal Si, is obtained.

In the step to form this oxide film, the oxide film 14 is obtained on the SOI layer 15 and the film thickness of the SOI layer 15 is adjusted to a predetermined film thickness (final film thickness). The film thickness of the oxide film 14 may be about 50 to 150 nm. As an example, the film thickness of the oxide film 14 is specified to be about 100 nm. Meanwhile, the film thickness of the SOI layer 15 is specified to be about 50 nm or more and 200 nm or less.

Then, as shown in FIG. 6 (c), in a step to form the fragile layer, hydrogen ions are implanted at the predetermined depth in the Si support substrate 13 from the oxide film 14 side of the surface of the SOI wafer 10 and, thereby, the fragile layer 17 is formed at the predetermined depth in the Si support substrate 13.

Implantation of hydrogen ions is performed by ion-implantation or ion doping at the implantation energy (acceleration voltage) at which the peak position of the distribution of hydrogen ions passed through the BOX layer 12 becomes within the Si support substrate 13. As for the hydrogen ion 16 implanted, $H^+$, $H_2^+$, and $H_3^+$ can be used. In this regard, a He ion may be implanted together with the H ion.

For example, as for the condition in the case where the $H^+$ ion is implanted (or ion doping), the implantation energy (acceleration voltage) is about 10 keV or more and 40 keV or less and the amount of implantation is about $1\times10^{16}/cm^2$ or more and $1\times10^{17}/cm^2$ or less.

Also, as for the condition in the case where the $H_2^+$ ion is mainly applied, the acceleration voltage is about 30 keV or more and 90 keV or less and the amount of implantation is about $1\times10^{16}/cm^2$ or more and $1\times10^{17}/cm^2$ or less.

Also, as for the condition in the case where ion implantation (or ion doping) including ions, such as, $H_3^+$, is performed, the implantation energy (acceleration voltage) is 55 keV or more and 150 keV or less and the amount of implantation is $1\times10^{16}/cm^2$ or more and $1\times10^{17}/cm^2$ or less.

Consequently, when hydrogen ions 16 are implanted from the oxide film 14 side, the hydrogen ions 16 pass through the oxide film 14, the SOI layer 15, and the BOX layer 12 and the fragile layer 17 can be formed in the inside of the Si support substrate 13 reliably.

Meanwhile, the acceleration voltage in application of hydrogen ions 16 is lower than the usual voltage. Therefore, the temperature of the ion-implanted SOI wafer 10 is suppressed from becoming high and the amount of implantation of hydrogen ions 16 can be increased. Consequently, ions are implanted in a treatment time of the level that does not decrease the throughput, and the fragile layer 17 can be formed in the inside of the Si support substrate 13. In this manner, a SOI substrate suitable for mass production can be obtained.

The depth at which the fragile layer 17 is formed is specified to be about 200 nm or more and 450 nm or less from the surface of the oxide film 14, as an example.

In the SOI wafer 10, the film thickness of the BOX layer 12 disposed in the SOI wafer 10 is small, so that hydrogen ions 16 implanted from the surface side of the oxide film 14 are allowed to pass through the oxide film 14, the SOI layer 15, and the BOX layer 12 and, thereby, the fragile layer 17 can be formed in the Si support substrate 13.

Damage (impairment of crystal structure) due to implantation of hydrogen ions 16 is at a maximum in the vicinity of the fragile layer 17 implanted (injected) with hydrogen ions 16, and it is believed that the spread of the damage (distance from implantation peak) is approximately within the projection dispersion ($\Delta Rp \approx 100$ nm) of the hydrogen ions 16. However, the fragile layer 17 is formed in the Si support substrate 13 under the BOX layer 12 and at a depth at which an influence of the projection dispersion of the hydrogen ions 16 is not exerted. Therefore, a serious damage layer does not remain in the SOI layer 15 used as an active layer thereafter. Consequently, a TFT (thin film transistor) having high performance and exhibiting small variations in characteristics can be formed by using the SOI layer 15.

Subsequently, as shown in FIG. 6 (*d*), in a step to place the SOI wafer 10 on a tray, a plurality of SOI wafers 10 provided with the fragile layer 17 are arranged in the matrix on a tray 21.

A plurality of concave portions 22 to place the SOI layers 11 are disposed in the matrix on the surface of the tray 21. Each of the plurality of SOI wafers 10 is carried and placed in each of the concave portions 22 by being sandwiched or adsorbed by a jig or a robot arm, for example. In this manner, the plurality of SOI wafers 10 are placed in the matrix on the tray 21.

Here, if the surface of the oxide film 14 of the SOI wafer 10 is touched when the SOI wafer 10 is carried and placed in the concave portion 22 of the tray 21, the possibility of occurrences of defects increases in the later step to bond the SOI wafer 10 to the base substrate 30.

Consequently, the SOI wafer 10 is placed in the concave portion 22 of the tray 21 by, for example, a placement tool 23, placement tool 24, or the like shown in FIG. 6 (*d*).

In the placement tool 23, arms 23*a* and 23*b* can be opened and closed in the directions shown by arrows A. The placement tool 23 can place the SOI wafer 10 into the concave portion 22 of the tray 21 without touching the surface of the oxide film 14 by sandwiching or releasing the side surface of the SOI wafer 10 with the arms 23*a* and 23*b*.

Also, the placement tool 24 fix and carry the SOI wafer 10 by supporting and adsorbing the back surface of the SOI wafer 10 (surface of the Si support substrate 13 which surface is on the reverse side of the surface provided with the oxide film 12: surface of the Si support substrate 13). The placement tool 24 can be moved in a slanting direction relative to the concave portion 22 of the tray 21 (directions shown by an arrow B in FIG. 6 (*d*)).

In placing the SOI wafer 10 into the concave portion 22 of the tray 21, the placement tool 24 is tilted and is drawn in a slanting direction while adsorption is weakened. Alternatively, although not shown in the drawing, the SOI wafer 10 may be placed on a vertically movable lift pin disposed on the bottom of the concave portion 22 of the tray 21, and after placement, the placement tool 24 may be drawn in a transverse direction, while adsorption is terminated. Thereafter, the lift pin is moved downward and the SOI wafer 10 is held in the concave portion 22 of the tray 21. In this manner, the placement tool 24 can place the SOI wafer 10 into the concave portion 22 of the tray 21 without touching the surface of the oxide film 14.

The depth of the concave portion 22 is specified to be smaller than the thickness of the SOI wafer 10 and, thereby, the surface of the oxide film 14 is protruded from the concave portion 22. This is for the purpose of bonding of the SOI wafer 10 to the base substrate 30 in the following step.

As described above, it is preferable that the vertically movable lift pin be disposed in the tray 21. This is because in the arrangement of the plurality of SOI wafers 10 on the tray 21, the SOI wafers can be placed at small intervals as compared with the case where the SOI wafers are placed while being tilted. Consequently, more SOI wafers 10 can be arranged.

In this regard, preferably, a vacuum adsorption mechanism is disposed on the tray 21, and the tray 21 is made from a material having chemical solution resistance (alkali resistance). This is because in the later step, when a surface treatment of the plurality of SOI wafers 10 disposed on the tray 21 is performed in a collective manner, in some cases, SCI washing or the like is performed, or spin drying, air knife drying, or the like is performed rather than a plasma treatment.

The tray 21 can be made from a material, e.g., quartz and stainless steel. The tray 21 having the chemical solution resistance (alkali resistance) is preferably formed from a material, e.g., Teflon (registered trademark) and PFA (tetrafluoroethylene).

As described above, in the step to place the SOI wafer 10 on the tray 21, each of the plurality of SOI wafers 10 is placed into each of the plurality of concave portions 22 disposed non-contiguously to each other in such a way that the oxide film 14 is located at the upper side in the SOI wafer 10.

Meanwhile, as shown in FIG. 6 (*e*), the base substrate 30 is prepared for the purpose of being bonded to the plurality of SOI wafers 10.

As for the base substrate 30, a substrate made from an insulating material, e.g., a glass substrate or a quartz substrate, can be used. As an example, a mother glass substrate developed for a liquid crystal panel production may be used as the base substrate 30.

For example, a large glass substrate of a fourth-generation (730 mm×920 mm), a sixth-generation (1,500 mm×1,850 mm), an eighth-generation (2,200×2,400 mm), or the like is used as the base substrate 30 and, thereby, a large area SOI substrate 32 bonded to a plurality of small SOI wafers 10 about 5 inch square (125 mm×125 mm) can be obtained, for example. It is desirable that the surface of the base substrate 30 be subjected to a planarizing treatment by performing CMP for the purpose of being bonded to the SOI wafer 10.

(Bonding Step)

Next, each of steps to bond the SOI wafers 10 to the base substrate 30 will be described with reference to FIG. 7 (*a*) to (*g*).

Figure 7:
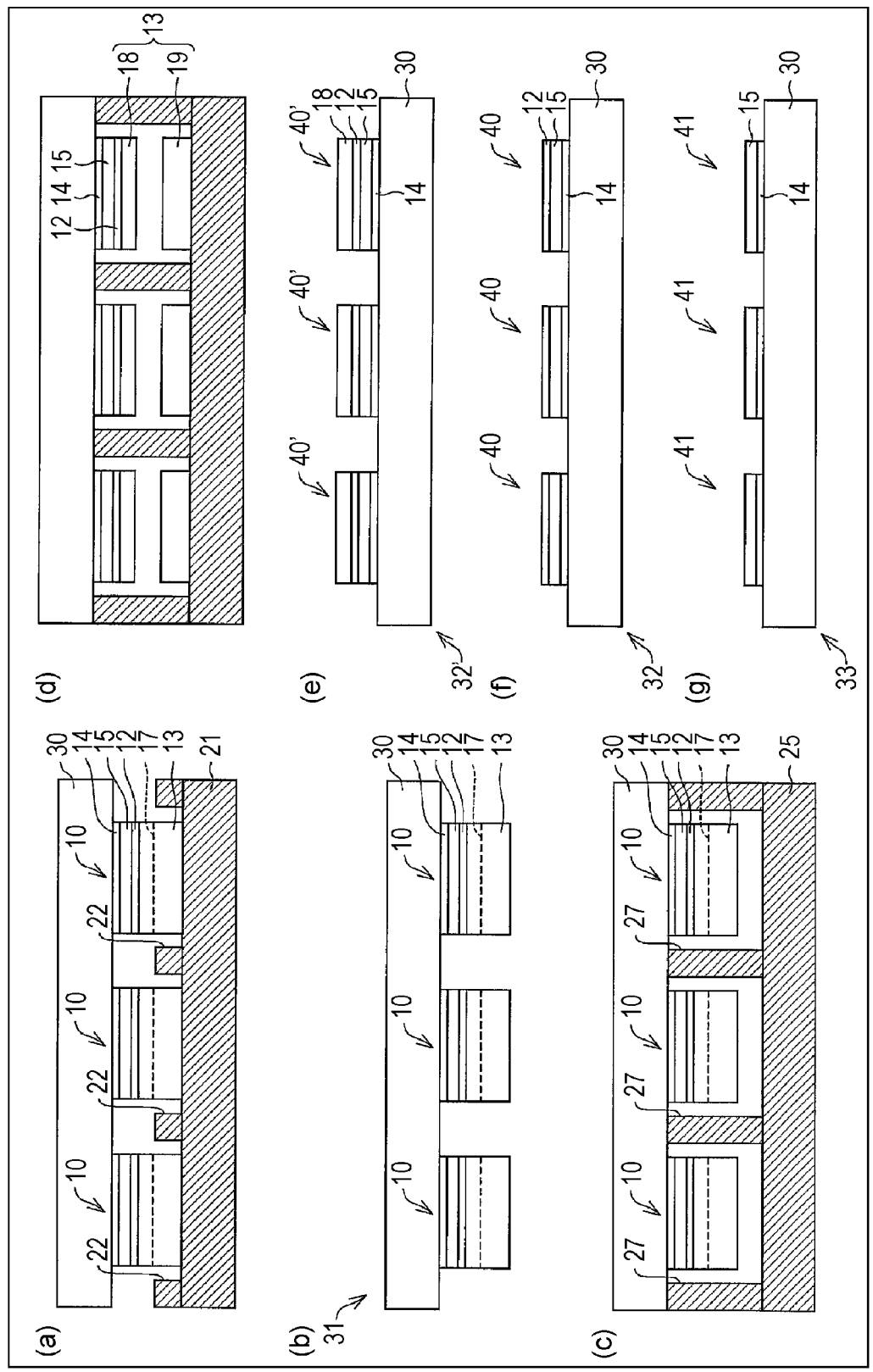
FIG. 7 is a diagram illustrating each step to bond a plurality of SOI wafers to a base substrate.

FIG. 7 (*a*) to (*g*) are diagrams illustrating each step to bond the plurality of SOI wafers 10 to the base substrate 30.

As shown in FIG. 7 (*a*), in the bonding step, initially, the surfaces of the oxide films 14 of the plurality of SOI wafers 10 placed on the tray 21 and the surface of the base substrate 30 are subjected to a plasma treatment or a chemical solution treatment, so that each of the surfaces is allowed to become hydrophilic.

In the case where the plasma treatment is performed, Ar plasma, atmospheric pressure plasma, and the like can be used. Alternatively, the hydrophilizing treatment may be applied to each of the surfaces of the SOI wafers 10 and the surface of the base substrate 30 by performing the chemical solution treatment, e.g., ozone water washing or SC1 washing, of the surfaces for about several minutes.

Subsequently, the hydrophilized surfaces are faced each other and the SOI wafers 10 and the base substrate 30 are bonded together, while the plurality of SOI wafers 10 are placed on the tray 21. Consequently, the surfaces of the oxide films 14 of the SOI wafers 10 and the surface of the hydrophilized surface of the base substrate 30 are joined by the Van der Waals force.

Then, a preannealing treatment at about 200° C. for about 2 hours is applied after the SOI wafers 10 and the base substrate 30 are joined and, thereby, a dehydration reaction proceeds at the interfaces between the oxide films 14 and the base substrate 30 and a covalent bond is formed, so that the joining can be made stronger.

In this manner, in the bonding step, the plurality of SOI wafers 10 are bonded to the base substrate 30 in a collective manner. Consequently, the SOI wafers 10 are bonded to the base substrate 30 in such a way that the oxide film 14 is located at the side close to the base substrate 30.

In this regard, the surface treatment to hydrophilize the surface of the SOI wafer 10 may be performed at the stage before placement on the tray 21, that is, in a step before the step to place the SOI wafer 10 on the tray 21.

Subsequently, as shown in FIG. 7(b), in a step to transfer the SOI wafer 10, the tray 21 holding the plurality of SOI wafers 10 bonded to the base substrate 30 is removed. Consequently, the plurality of SOI wafers 10 placed on the tray 21 are transferred to the base substrate 30 and, as a result, a bonded substrate 31 can be obtained.

As described above, the plurality of SOI wafers 10 have been placed non-contiguously to each other and, therefore, the plurality of SOI wafers 10 transferred to the base substrate 30 are also disposed non-contiguously to each other on the base substrate 30.

Then, as shown in FIG. 7 (c), in a step to place the bonded substrate 31 to a tray 25, the bonded substrate 31 is placed on the tray 25 disposed under the bonded substrate 31.

The tray 25 includes concave portions 27 formed in such a way that the plurality of SOI wafers 10 can be stored. The concave portion 27 included in the tray 25 has a depth different from the depth of the concave portion 22 of the tray 21.

The depth of the concave portion 27 of the tray 25 is specified to be one size larger than the thickness of the SOI wafer 10. That is, the depth of the concave portion 27 is specified to be larger than the thickness of the SOI wafer 10. Consequently, the SOI wafer 10 is stored in the concave portion 27 of the tray 25.

The reason the SOI wafer 10 is stored in the concave portion 27 of the tray 25, as described above, is that single crystal silicon which is part of the Si support substrate 13 separated in the heat treatment of the following step is allowed to fall into the concave portion 27 of the tray 25 and is recovered.

In this regard, the tray 25 is not necessarily located under the bonded substrate 31. For example, as with PTL 4, the direction of the bonded substrate 31 may be changed in such a way that the plurality of SOI wafers 10 are disposed above the base substrate 30 and the tray 25 may be placed on the bonded substrate 31 in such a way that the SOI wafer 10 is covered with the concave portion 27. That is, a configuration in the vertically flipped state of the configuration in FIG. 7 (c) may be employed. It is desirable that the material for the tray 25 be quartz because a high-temperature heat treatment is performed in the following step.

Also, the tray 25 does not necessarily have the above-described configuration. For example, although not shown in the drawing, a vertically movable lift pin may be disposed on the bottom of the concave portion 27 of the tray 25, single crystal silicon, which is part of the Si support substrate 13 separated in the heat treatment, may be allowed to fall on the lift pin and be recovered.

Thereafter, as shown in FIG. 7 (d), in a step to separate part of the Si support substrate 13, the SOI wafer 10 stored in each of the concave portions 27 is heat-treated and, thereby, the Si support substrate 13 is separated into a single crystal Si layer 18 and the single crystal Si layer 19 along the fragile layer 17.

In the heat treatment, heat of about 500° C. or higher and 700° C. or lower is applied to the bonded substrate 31. According to this, fine voids formed in the fragile layer 17 in the Si support substrate 13 are expanded to generate cracks. Consequently, in the Si support substrates 13, the individual single crystal Si layers 19 below the fragile layers 17 are separated along the fragile layers 17 and fall into the concave portions 27 of the tray 25 because of gravity.

On the other hand, in the Si support substrate 13, the remaining single crystal Si layer 18 having a film thickness of about 100 nm is transferred to the base substrate 30.

Subsequently, as shown in FIG. 7 (e), the tray 25 is removed and, thereby, the single crystal Si layers 19 fallen into the concave portions 27 are recovered. In this manner, a bonded substrate 32', in which a plurality of SOI wafers 40' transferred are disposed non-contiguously to each other on the base substrate 30, can be obtained, where the single crystal Si layer 18, the BOX layer 12, the SOI layer 15, and the oxide film 14 are stacked sequentially in the SOI wafer 40'. The bonded substrate 32' is a substrate before etch back treatment.

Then, as shown in FIG. 7 (f), in a step to perform an etch back treatment, the bonded substrate 32' is subjected to dry etching and, thereby, the etch back treatment to remove the single crystal Si layers 18 is performed. Consequently, a SOI substrate 32, in which a plurality of SOI wafers 40 produced by removing the single crystal Si layers 18 from the SOI wafers 40' are disposed on the base substrate 30, can be obtained.

In the bonded substrate 32' before the etch back treatment is performed, the BOX layer 12 is disposed under the single crystal Si layer 18. Therefore, in the etch back treatment, even when in-plane distribution of the etch rate is generated, the BOX layer 12 serves as an etch stopper. Consequently, the transferred SOI layer 15 under the BOX layer 12 is not etched, so that the large SOI substrate 32 including the SOI layer 15 having a uniform film thickness in the SOI substrate 32 and, moreover, in the SOI wafer 40, can be obtained.

As described later, a TFT exhibiting small variations in characteristics can be obtained by forming, for example, the TFT through the use of the SOI substrate 32. Furthermore, a display panel exhibiting no display variations can be obtained by forming a display panel through the use of this TFT.

Meanwhile, in the SOI substrate 32, the film thickness in the SOI wafer 40 is also uniform, and an area in which display panels can be formed (that is, area of region provided with SOI layers 15 having a uniform film thickness) can be ensured sufficiently in one SOI wafer 40. Consequently, the display panel acquisition efficiency increases, and an improvement in the yield and cost reduction can be realized.

Subsequently, as shown in FIG. 7 (g), in a step to remove the BOX layer, the SOI substrate 32 shown in FIG. 7 (f) is subjected to wet etching or dry etching, so as to remove the BOX layer 12 and expose the SOI layer 15 under the BOX layer 12.

In this manner, a SOI substrate 33, in which a plurality of SOI wafers 41 produced by removing the BOX layer 12 from the SOI wafer 40 are disposed on the base substrate 30, can be obtained. This BOX layer 12 is removed because a gate insulating film is formed all over the SOI substrate 33 in the later step.

The wet etching to remove the BOX layers 12 can be performed using HF (hydrofluoric acid), $NH_4F$ (ammonium fluoride), or the like. As for the wet etching, the in-plane distribution of the etching rate is small, and etching proceeds all over the SOI substrate 33 uniformly, so that the BOX layers 12 can be removed uniformly, and the SOI layers 15 having a uniform film thickness can be obtained all over the large SOI substrate 33.

On the other hand, the dry etching to remove the BOX layers 12 can be performed using parallel plate type RIE or the like. The dry etching exhibits in-plane distribution of the etching rate larger than that of the wet etching. However, in the case where the selection ratio of the BOX layer to the silicon film (SOI layer 15) thereunder can be ensured to some extent, the BOX layer can be removed at a speed higher than the wet etching. Therefore, the SOI layers 15 having a uniform film thickness can be obtained all over the large SOI substrate 33 with a high throughput.

In this step to remove the BOX layer, the exposed BOX layers 12 are removed, the plurality of SOI layers 15 are exposed and, thereby, a gate insulating film can be formed again all over the SOI substrate 33 while the BOX layers 12 have been removed. Therefore, the film thickness of the gate insulating film is adjusted easily. In addition, a highly versatile SOI substrate 33 capable of forming a TFT and the like compatible with various processes (for liquid crystal, for organic EL, and the like) can be obtained.

In this manner, the SOI substrate 33 can be obtained.

In PTL 7 described above, a film functioning as an etch stopper is not present. Therefore, if the etch back treatment is performed to decrease the film thickness of the Si film, variations in the Si film transferred to the glass substrate occur because of the etch back treatment. Reflecting film thickness variations in the Si film, there is a problem in that variations in the TFT characteristics (threshold value) increase.

Variations in the TFT characteristics appear as an increase in power consumption accompanying an increase in circuit design margin and display variations of a panel.

On the other hand, according to the SOI substrate 33, the BOX layer 12 serving as an etch stopper in the etch back treatment is disposed prior to the etch back treatment. Consequently, even when the etch back treatment is performed, occurrences of variations in the film thickness of the SOI layers 15 can be prevented. Therefore, according to the SOI substrate 33, a TFT exhibiting small TFT characteristic (threshold value) variations can be obtained. In this manner, the circuit design margin can be decreased to a small level, and a high-speed, low-power consumption circuit can be realized.

Meanwhile, in PTL 8, the fragile layer is disposed in the BOX layer. However, the BOX layer does not have a crystalline structure and, therefore, even when hydrogen ion implantation is performed, it is difficult to cause peeling at the hydrogen ion implanted surface (that is, fragile layer) clearly.

On the other hand, according to the SOI substrate 33, the fragile layer 17 is formed in the Si support substrate 13 by implanting hydrogen ions 16, which are allowed to pass through the BOX layer 12 having a small film thickness, into the Si support substrate 13 made from single crystal Si. Therefore, part of the Si support substrate 13 can be separated at the fragile layer 17 reliably.

Meanwhile, in PTL 7, the film thickness variations in the Si film occur by the etch back treatment and, thereby, there are problems in that, after the etch back treatment, the peripheral portion of the Si film is made thin or disappears, the area of the region, in which a panel having a uniform film thickness can be disposed, decreases in the Si film, and accompanying that, the number of acquisition of panels decreases.

On the other hand, according to the SOI substrate 33, the BOX layer 12 functioning as an etch stopper in the etch back treatment is disposed. Consequently, even when the etch back treatment is performed, film thicknesses of the corner portions and central portions of the SOI wafer 41 can be prevented from becoming small. In this manner, the area, in which a panel having a uniform Si film thickness can be disposed, can be ensured and the number of acquisition of panels can be improved.

(TFT Forming Step)

Next, each of steps to form TFTs will be described with reference to FIG. 8 (a) to (g).

Figure 8:
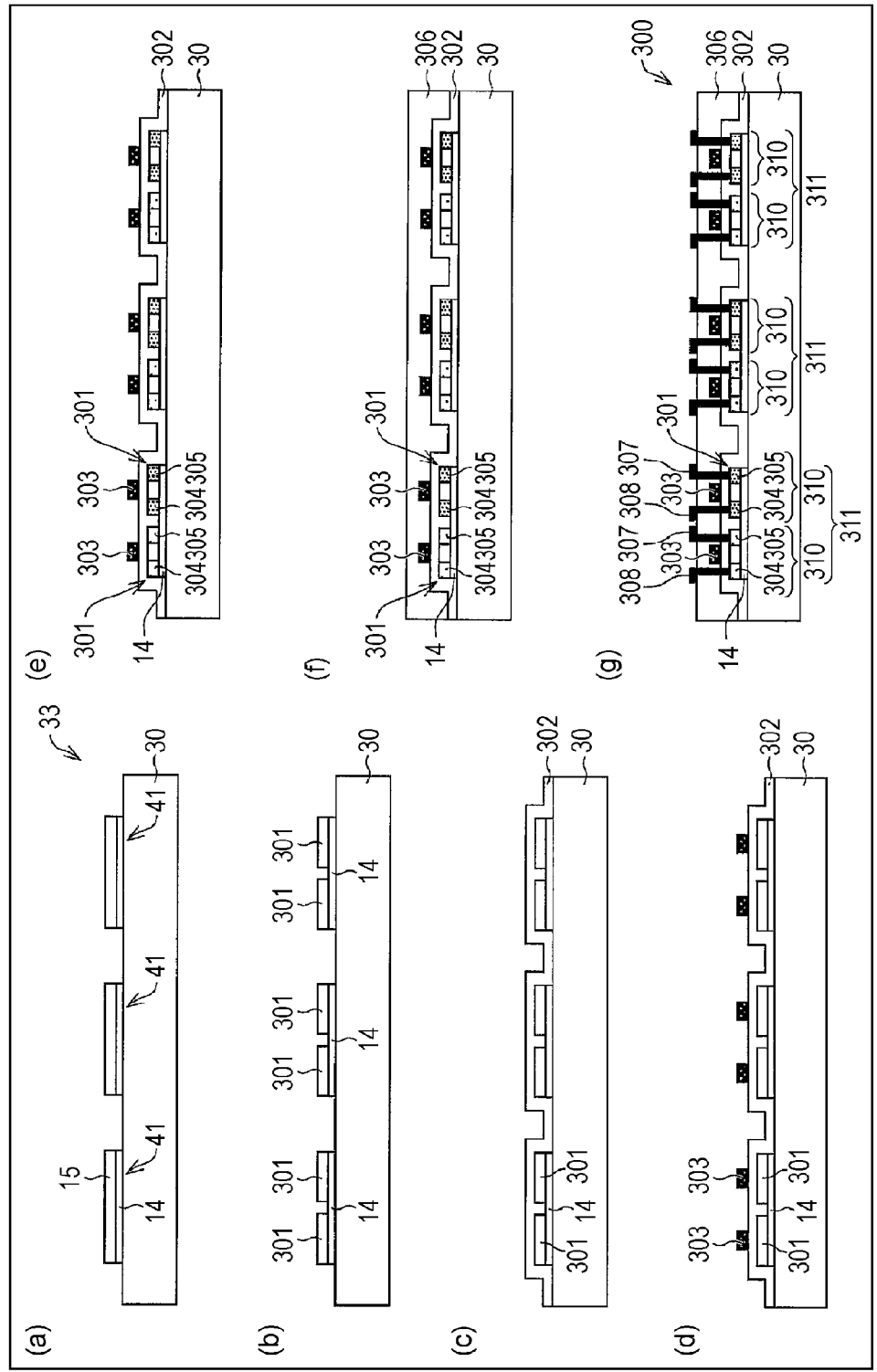
FIG. 8 is a diagram illustrating each step to form TFTs on the SOI substrate according to the first embodiment of the present invention.

FIG. 8 (a) to (g) are diagrams illustrating each of steps to form TFTs on the SOI substrate.

As shown in FIG. 8 (a), a step to remove the peripheral portion and a step to perform a laser treatment may be included.

In the step to remove the peripheral portion, initially, the peripheral portions of the SOI layer 15 and the oxide film 14 transferred to the base substrate 30 are removed by photolithography and etching. Consequently, the area of the SOI layer 15 transferred to the base substrate 30 becomes one size small and the region in which a panel can be disposed decreases to some extent.

The peripheral portion of the SOI layer 15 transferred to the base substrate 30 has weak adhesion and if a TFT or the like is produced without removing the peripheral portion, occurrences of defects may be caused. Therefore, it is preferable that a step to remove the peripheral portion be included and the peripheral portions of the SOI layer 15 and the oxide film 14 transferred to the base substrate 30 be removed in advance.

In this regard, the step to remove the peripheral portion may be performed before the SOI layer 15 and the oxide film 14 are bonded to the base substrate 30, that is, between the step to form the fragile layer (FIG. 6 (c)) and the step to place the SOI wafer 10 on the tray (FIG. 6 (d)).

Subsequently, as shown in FIG. 8 (a), in a step to perform a laser treatment, laser is applied to the surface of the SOI layer 15 from which the peripheral portion have been removed.

In the step to perform a laser treatment, for example, a XeCl excimer laser with a wavelength of 308 nm can be used. The irradiation energy density depends on the film thickness of the transferred SOI layer 15, and in the case where the film thickness of the SOI layer 15 is about 130 nm, about 400 mJ/cm$^2$ or more and 700 mJ/cm$^2$ is employed.

In the step to perform a laser treatment, laser is applied to the surface of the SOI layer 15 and, thereby, the surface of the SOI layer 15 can be recrystallized by the laser, so that protruded portions on the surface of the SOI layer 15 are eliminated and planarization can be performed. In this manner, the SOI substrate 33 capable of forming a high-voltage TFT element can be obtained. Also, defects in the inside of the SOI layer 15 generated because of ion implantation can be repaired and reduced by recrystallization through laser irradiation. Consequently, the SOI layer 15 capable of forming a high-performance TFT element having few defects can be obtained.

In this regard, the above-described step to remove the peripheral portion and the step to perform a laser treatment may be included optionally. Also, the step to perform a laser treatment may be executed after the following step to convert to islands, and laser may be applied to the SOI layer 15 converted to islands.

In the following step and afterward, a TFT may be formed using a common TFT forming process (conversion to islands→gate insulating film formation→gate electrode formation→source/drain ion implantation→interlayer deposition→activation→contact hole formation→metal wiring formation) of poly-Si and the like. The TFT forming step will be described below simply.

As shown in FIG. 8 (b), in the step to convert to islands, the SOI layer 15 optionally subjected to the laser treatment of the surface is converted to islands in a predetermined TFT pattern by, for example, photolithography. In this manner, a SOI layer 301 formed on the oxide film 14 and converted to islands in such a way as to expose part of the oxide film 14 is obtained.

Thereafter, as shown in FIG. 8 (c), in a step to form a gate insulating film, a gate insulating film 302 is formed covering the SOI layer 301, the exposed surface of the oxide film 14, and the base substrate 30 by, for example, a CVD method.

The gate insulating film 302 is formed having a film thickness of about 20 nm or more and 200 nm or less. As for the material for the gate insulating film 302, $SiO_2$, SiON, a material by combination thereof, or the like can be used.

Then, as shown in FIG. 8 (d), in a step to form a gate electrode, a film of gate electrode material is formed above the SOI layer 301 and on the surface of the gate insulating film 302 by, for example, a sputtering method, and a gate electrode 303 is patterned by photolithography.

The gate electrode 303 is formed having a film thickness of about 50 nm or more and 400 nm or less. As for the material for the gate electrode 303, W, Mo, MoW, Al, Al—Si, Ti, a material by combination thereof, or the like can be used.

Subsequently, as shown in FIG. 8 (e), in a step to form a source region and a drain region, the gate electrode 303 is used as a mask, and the source region and the drain region are formed in the SOI layer 301 by applying ion doping or ion implantation to each of the SOI layer 301.

In the case where the Nch-TFT is formed, the source region 305 and the drain region 304 may be subjected to ion doping or ion implantation of P, As, or the like. Also, in the case where the Pch-TFT is formed, the source region 305 and the drain region 304 may be subjected to ion doping or ion implantation of B (boron) or the like.

Then, as shown in FIG. 8 (f), in a step to form an interlayer insulating film, as an example, a CVD method is used and an interlayer insulating film 306 is formed all over the base substrate 30 in such a way as to cover the gate electrode 303 and the gate insulating film 302.

The interlayer insulating film 306 is formed having a film thickness of about 200 nm or more and 600 nm or less. As for the material for the interlayer insulating film 306, $SiO_2$, SiON, a material by combination thereof, or the like can be used.

Thereafter, in a step to perform a heat treatment, for the purpose of activating ions implanted into the source region 305 and the drain region 304, a heat treatment is performed. In the step to perform a heat treatment, furnace annealing at 550° C. or higher and 600° C. or lower for 1 to 2 hours or a RTA treatment at 550° C. or higher and 650° C. or lower for about 10 min is performed.

Subsequently, as shown in FIG. 8 (g), in a source electrode and drain electrode forming step, initially, contact holes are formed in the gate insulating film 302 and the interlayer insulating film 306 by, for example, photolithography and etching.

Then, films of a source•drain electrode material are formed on the interlayer insulating film 306 and in the contact holes by, for example, a sputtering method. Thereafter, the source•drain electrode material made into films are patterned, so that source electrodes 307 connected to the source regions 305 through the contact holes can be formed on the interlayer insulating film 306. Also, drain electrodes 308 connected to the drain regions 304 through the contact holes can be formed on the interlayer insulating film 306.

As for the source•drain electrode material, Al, Al—Si, Ti, and the like can be used.

In this manner, a transistor substrate 300 can be obtained, in which a plurality of Nch (n channel) or Pch (p channel) TFTs 310 including at least SOI layers 301 serving as an active layer provided with the source region 305•drain region 304, gate electrodes 303, source electrodes 307, and drain electrodes 308 are formed on the base substrate 30.

Meanwhile, a TFT 310 of Nch and a TFT 310 of Pch may be formed on one oxide film 14, and a CMOS (complementary MOS transistor) circuit 311 may be formed by the combination thereof.

In the transistor substrate 300, the film thicknesses of the plurality of SOI layers 301 serving as the active layers are uniform and, therefore, characteristic variations between the plurality of TFTs 310 are small. Consequently, according to the transistor substrate 300, a high-performance low-variation TFT backplane suitable for a liquid crystal panel, an organic EL panel, and the like can be obtained.

A liquid crystal panel and an organic EL panel, which exhibit small display variations and in which a low-power consumption CMOS circuit 311 is formed monolithically, can be obtained by executing a liquid crystal panel producing step and an organic EL panel producing step through the use of the transistor substrate 300.

Also, various semiconductor circuits can be realized by using the CMOS circuit 311. For example, it is possible to form an amplifier circuit, a power supply circuit, a feedback circuit, a differential amplifier circuit, a phase compensation circuit indispensable for radio communication, a filter circuit, and the like.

The transistor substrate 300 obtained in the present embodiment is a very large glass substrate and, therefore, may be used by being cut into a size of a required panel or the like in the apparatuses described below.

(Electronic Device)

Next, the configuration of each electronic device formed using the transistor substrate 300 will be described.

To begin with, an liquid crystal display device obtained using the transistor substrate 300 will be described.

Figure 9:
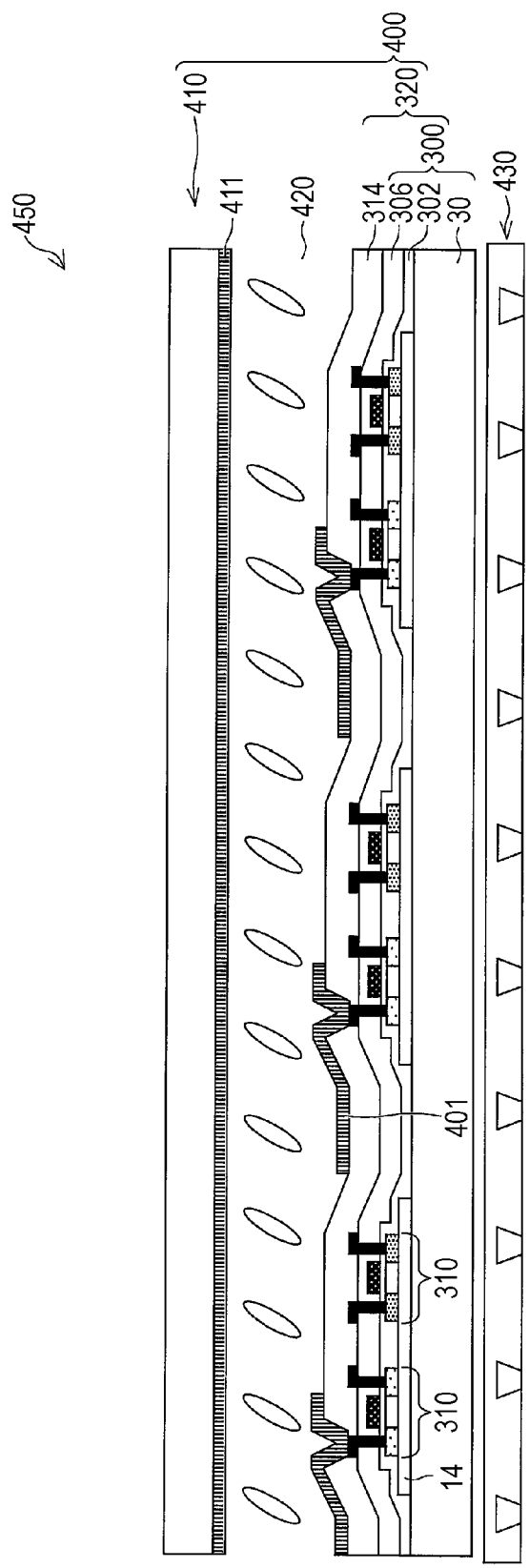
FIG. 9 is a sectional view showing a liquid crystal display device formed using a transistor substrate according to the present embodiment.

FIG. 9 is a sectional view showing a liquid crystal display device formed using a transistor substrate 300 according to the present embodiment.

The transistor substrate 300, as shown in FIG. 8 (g), is used as an active matrix substrate 320, and part of the TFTs 310 are allowed to function as a transistor for pixel (switching element) to drive each pixel.

In production of the active matrix substrate 320, initially, an interlayer insulating film 314 is stacked on the interlayer insulating film 306 of the transistor substrate 300 while covering the source electrodes 307•drain electrodes 308, and contact holes are disposed in the interlayer insulating film 314 on the drain electrodes 308 of the stacked interlayer insulating film 314.

Subsequently, a pixel electrode 401 is formed as a layer on the interlayer insulating film 314, and the pixel electrode 401 is connected to the drain electrode 308 of each of the TFTs 310 through the contact hole. In this manner, the active matrix substrate 320 provided with the TFTs 310 serving as the switching elements for the pixels is obtained.

Also, a liquid crystal driving circuit may be formed by combining TFTs 310 other than the transistors for pixels. Also, a photodetection element and a photodiode may be further disposed on the active matrix substrate 320, and the TFT 310 may be formed for driving control of the photodetection element concerned. Consequently, a liquid crystal display device with a touch panel function can also be configured, wherein the touch panel function is realized by detecting the position of the light received by the photodetection element.

The active matrix substrate 320 provided with the pixel electrodes 401 and a counter substrate 410 provided with a counter electrode 411 are bonded and sealed, a liquid crystal 420 is injected between the two substrates and, thereby, a liquid crystal panel 400 is obtained. The resulting liquid crystal panel 400 plays a role like a shutter in which the orientation of the liquid crystal 420 is changed by application of a voltage so as to pass or block the light of each pixel. Therefore, a liquid crystal display device 450 is obtained, wherein a backlight module 430 is disposed on the back of the liquid crystal panel 400 and images are displayed on the basis of ON and OFF of the light from the backlight module 430 by the liquid crystal 400 in the same manner as a shutter. An LED, a cold cathode tube, and the like can be used for the backlight module 430.

Next, an electroluminescent device obtained using the transistor substrate 300 will be described.

Figure 10:
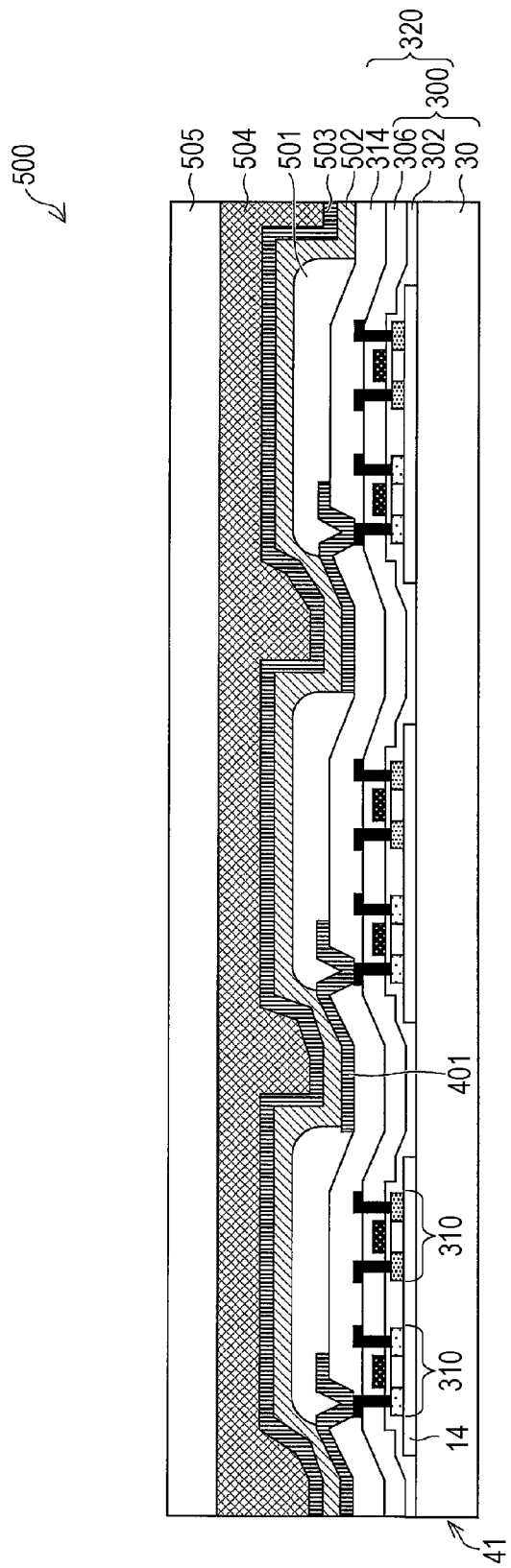
FIG. 10 is a sectional view showing an electroluminescent device formed using a transistor substrate according to the present embodiment.

FIG. 10 is a sectional view showing an electroluminescent device 500 formed using the transistor substrate 300 according to the present embodiment.

Initially, the active matrix substrate 320 is produced in the same manner as the liquid crystal display device 450 shown in FIG. 9.

Thereafter, isolation layers 501 to avoid an occurrence of short circuit between adjacent pixels are formed on the active matrix substrate 320 provided with the pixel electrodes 401. Subsequently, a layer formed containing an electroluminescent material (EL layer 502), a counter electrode 503, and a resin layer 504 may be formed sequentially, and finally, a counter substrate 505 for protection may be bonded. A current passes the EL layer 502 sandwiched by the individual pixel electrodes 401 and the counter electrode 503 and, thereby, the electroluminescent (EL) device 500 in which the EL layer 502 emits light is obtained.

This electroluminescent device 500 can be used for a display device, e.g., a display, and can also be used for a light emitting device, e.g., illumination.

Next, a radio communication device obtained using the transistor substrate 300 will be described.

Figure 11:
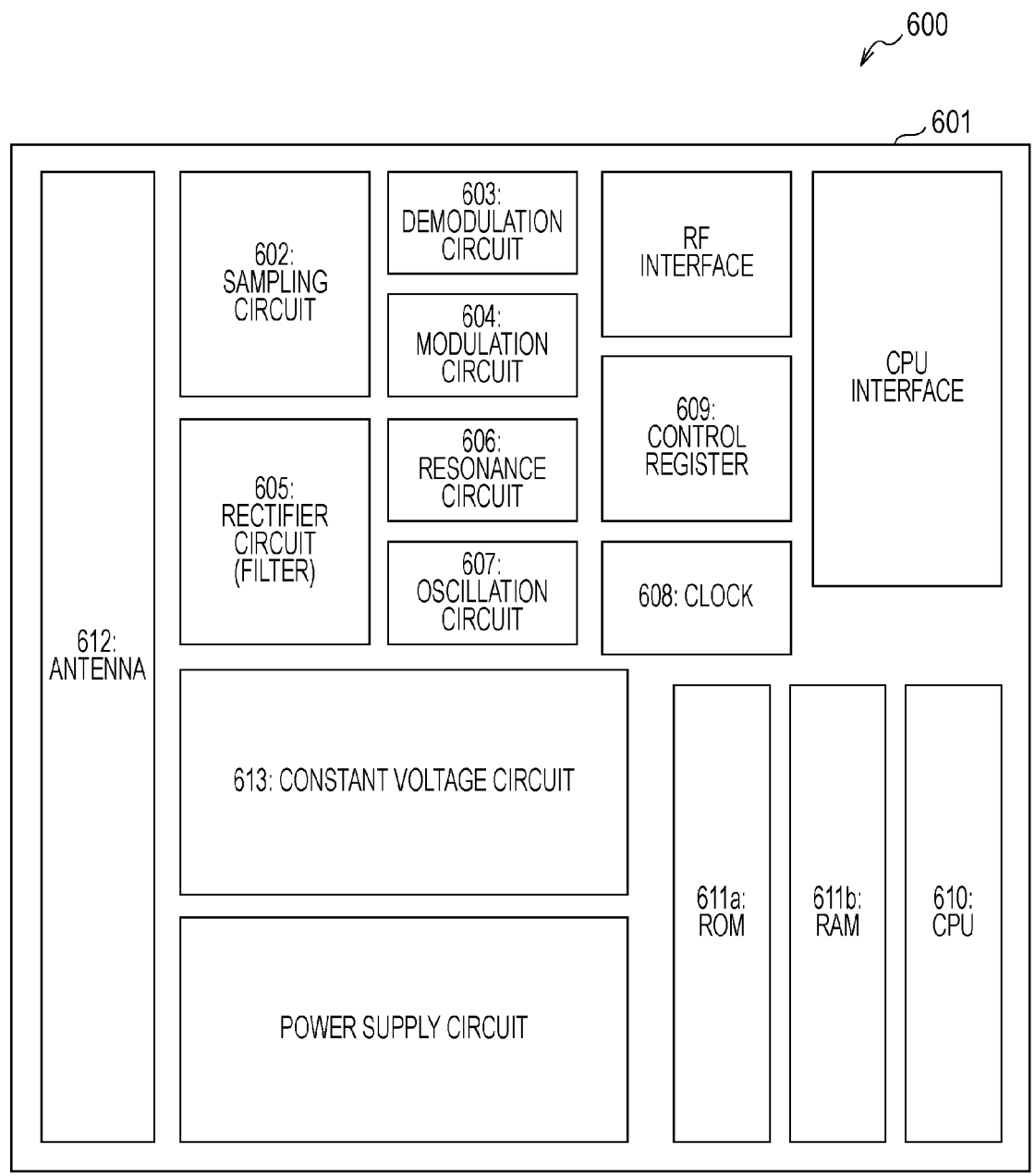
FIG. 11 is a circuit block diagram illustrating a radio communication device formed using a transistor substrate according to the present embodiment.

FIG. 11 is a circuit block diagram illustrating a radio communication device formed using the transistor substrate 300 according to the present embodiment. It may be considered that the structure in itself of a radio communication device 600 is basically the same as that of the CMOS circuit 311 shown in FIG. 8 (g). The radio communication device 600 is provided with a radio communication circuit 601 in which each of the circuits is formed by the transistor substrate 300 shown in FIG. 8 (g).

The radio communication circuit 601 of the radio communication device 600 is formed from, for example, an antenna 612 and a sampling circuit 602 to receive radio waves, a demodulation circuit 603 to demodulate the received radio waves or a modulation circuit 604 to superimpose signals on a carrier wave, a rectifier (filter) circuit 605 to obtain predetermined frequency characteristics, communication circuits, e.g., a resonance circuit 606 and an oscillation circuit 607, to resonate and oscillate signals, power supply circuits, e.g., a constant voltage circuit 613 to feed a constant voltage to the individual circuits, control circuits, e.g., a clock 608 and a control register 609 to adjust the timing of exchange of signals and a CPU 610 to operate them, and memory circuits, e.g., ROM 611a and RAM 611b, to store data.

Next, a light emitting device obtained using the transistor substrate 300 will be described.

Figure 12:
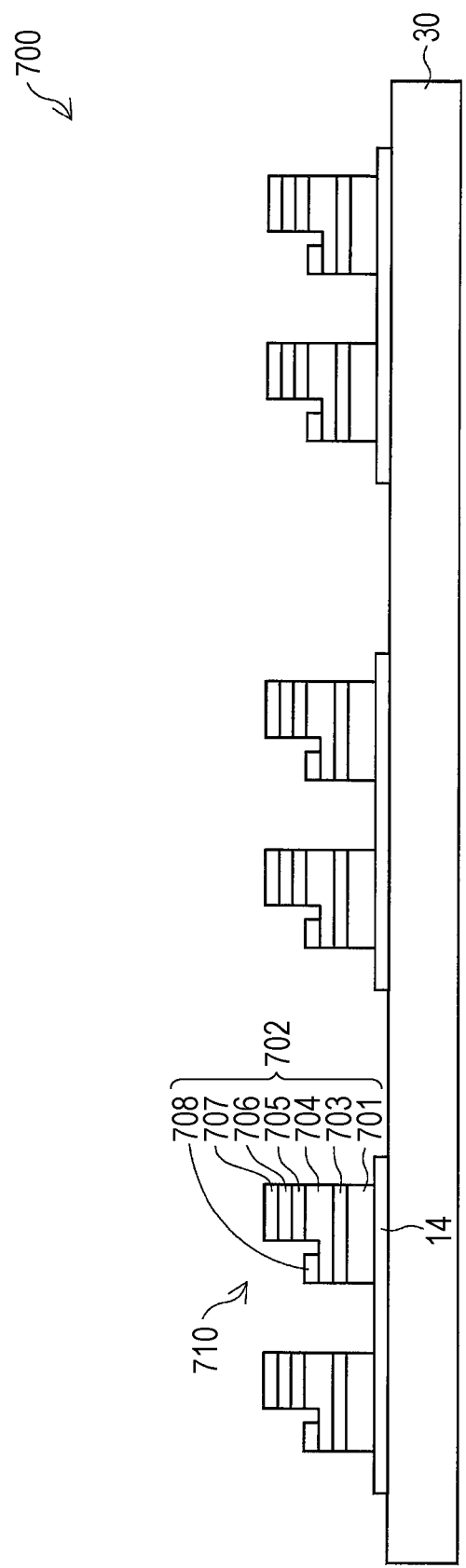
FIG. 12 is a schematic diagram illustrating a light emitting device formed using a transistor substrate according to the present embodiment.

FIG. 12 is a schematic diagram illustrating a light emitting device formed using a transistor substrate 300 according to the present embodiment. Compound semiconductors, e.g., GaN and GaAs, in place of the SOI layers 301, which is single crystal silicon described in the embodiment, are formed on the oxide film 14. That is, a stacked film 702 of compound semiconductor films epitaxially grown on a sapphire substrate 701 has been transferred to the oxide film 14 on the base substrate 30.

The stacked film 702 is formed by stacking a buffer layer 703, an n-contact layer 704, a light emitting layer 705, a p-contact layer 706, and a p-electrode 707 sequentially from the sapphire substrate 701 side, and stacking an n-electrode 708 non-contiguously to the light emitting layer 705 on the n-contact layer 704.

In this manner, the LEDs 710 serving as light emitting elements are formed on the base substrate 30 and, thereby, a light emitting device 700 is obtained.

(Electronic Apparatus)

Next, electronic apparatuses which can be produced using the above-described electronic devices produced using the transistor substrate 300 will be described with reference to FIG. 13 (a) to (e).

Figure 13:
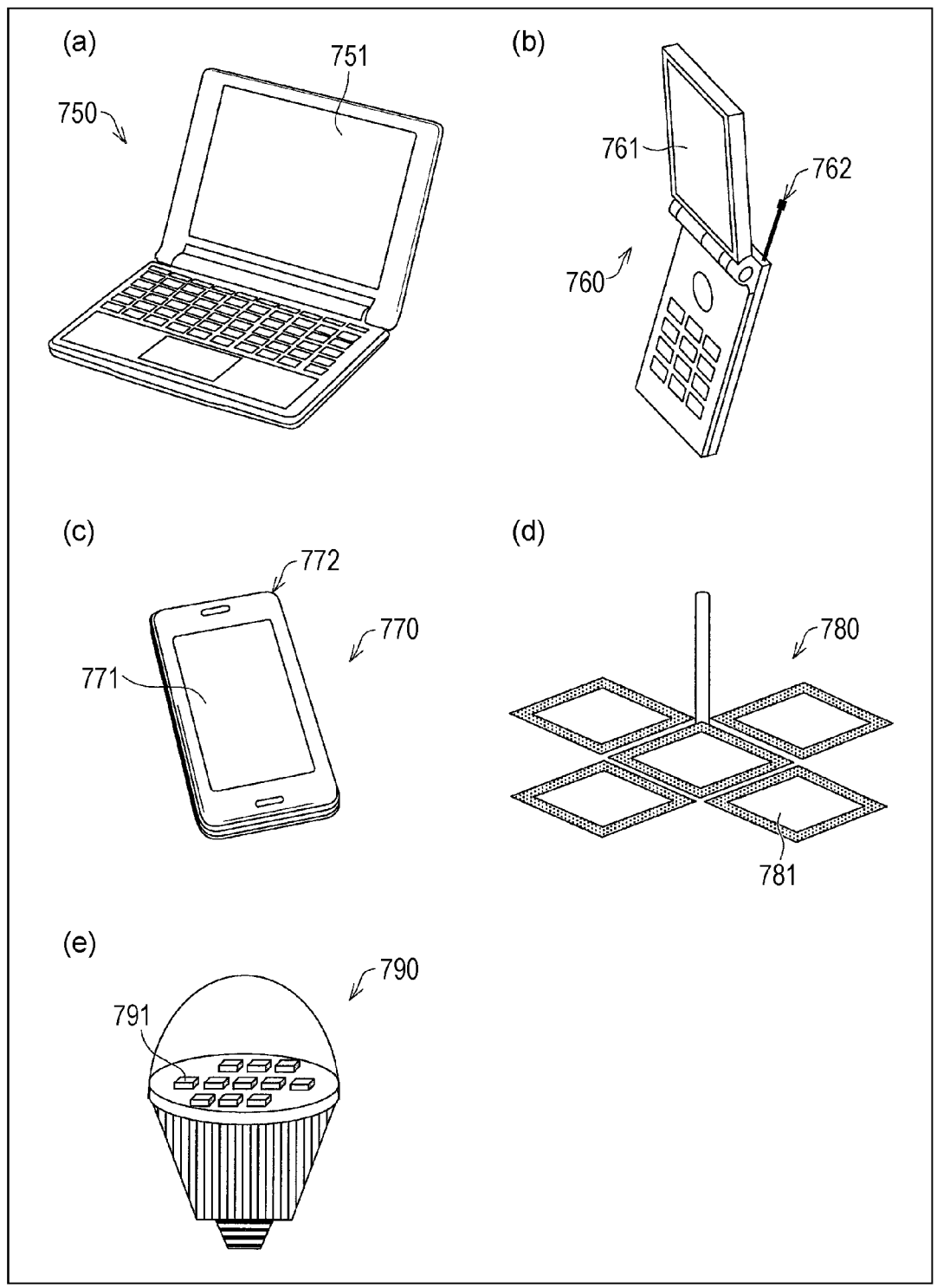
FIG. 13 shows examples of applied goods images using the liquid crystal display device, the electroluminescent device, the radio communication device, the light emitting device, and the like according to the present embodiment.

FIG. 13 (a) to (e) show examples of applied goods images, where electronic apparatuses are formed using the individual electronic devices, e.g., the liquid crystal display device, the electroluminescent device, the radio communication device, and the light emitting device, according to the present embodiment. The liquid crystal display device 450 and the electroluminescent device 500 can be used for a display portion 751 of a personal computer (PC) 750 shown in FIG. 13 (a), a display portion 761 of a cellular phone 760 shown in FIG. 13 (b), and a display portion 771 of, for example, a radio communication apparatus 770 shown in FIG. 13 (c). The radio communication device 600 can be used for a radio communication portion 762 of the cellular phone 760 shown in FIG. 13 (b) and a radio communication portion 772 of, for example, the radio communication apparatus 770 shown in FIG. 13 (c). In addition, the electroluminescent device 500 can be used for not only the display portions 751, 756, and 771 but also light emitting portion 781 of, for example, organic EL illumination 780 shown in FIG. 13 (d). The light emitting device 700 can be used for a light emitting portion 791 of, for example, LED light bulb (electronic apparatus) 790 shown in FIG. 13 (e).

[Second Embodiment]

Next, a second embodiment according to the present invention will be described with reference to FIG. 5 to FIG. 8 and FIG. 14 (a) to (f). In this regard, for the convenience of explanation, the members having the same functions as those in the drawings explained in the above-described first embodiment are indicated by the same reference numerals as those set forth above and the explanations thereof will not be provided.

As described above, in the first embodiment, the plurality of SOI wafers 10 are transferred to the base substrate 30 which is a large glass substrate, etch back is performed, the BOX layers 12 are removed, a new gate insulating film 302 is formed all over the surface and, thereby, the transistor substrate 300 is obtained.

On the other hand, the present second embodiment is different from the method for manufacturing a semiconductor substrate described in the first embodiment in that the BOX layers 12 are not removed, and the semiconductor substrate is obtained using the BOX layers 12 as part of the gate insulating film.

The BOX layer 12 is a high-quality thermal oxidation film and, therefore, a TFT formed using this as the gate insulating film exhibits good interfacial characteristics (sharp S value). Steps to produce this semiconductor substrate are substantially the same as those in the first embodiment, so that different points are mainly explained.

Initially, a SOI wafer is obtained in which the film thickness of the BOX layer is 50 nm or less. This SOI wafer can be formed by using, for example, the Smart Cut method, as described above.

As shown in FIG. 5 (a), initially, in the step to form the thermal oxidation film, the Si wafer made from single crystal Si is subjected to the thermal oxidation treatment and, thereby, the thermal oxidation film ($SiO_2$) 12' is formed on the surface of the single crystal Si layer 2. In this manner, the Si wafer 1 in which the thermal oxidation film 12' is disposed on the surface of the single crystal Si layer 2 is obtained.

Here, the thermal oxidation film 12' serves as the BOX layer 12 thereafter and is formed in such a way that the film thickness becomes 50 nm or less. Furthermore, the oxidation time of the thermal oxidation film formation is adjusted in advance in such a way that the total thickness of the thickness of the gate insulating film 302 formed in the later step (Step to form gate insulating film shown in FIG. 14 (d)) and the thickness of the thermal oxidation film 12' becomes a predetermined film thickness of a gate insulating film 313.

As an example, the single crystal silicon substrate is subjected to a wet oxidation treatment at 850° C. For example, the thermal oxidation treatment may be performed for about 15 min in the case where about 20 nm of thermal oxidation film 12' is formed and for about 45 min in the case where abut 50 nm is formed.

Subsequently, as is explained with reference to FIG. 5 (b) to (e), the Si wafer 1 is subjected to the individual treatments of the step to form the fragile layer, the step to perform the surface treatment, the bonding step, and the step to transfer single crystal Si to the support substrate sequentially and, thereby, the SOI wafer 10 can be obtained.

Then, as is explained with reference to FIG. 6 (a) to (e), the SOI wafer 10 and the base substrate 30 are obtained through the individual steps before bonding of the SOI wafer to the insulating substrate.

Figure 14:
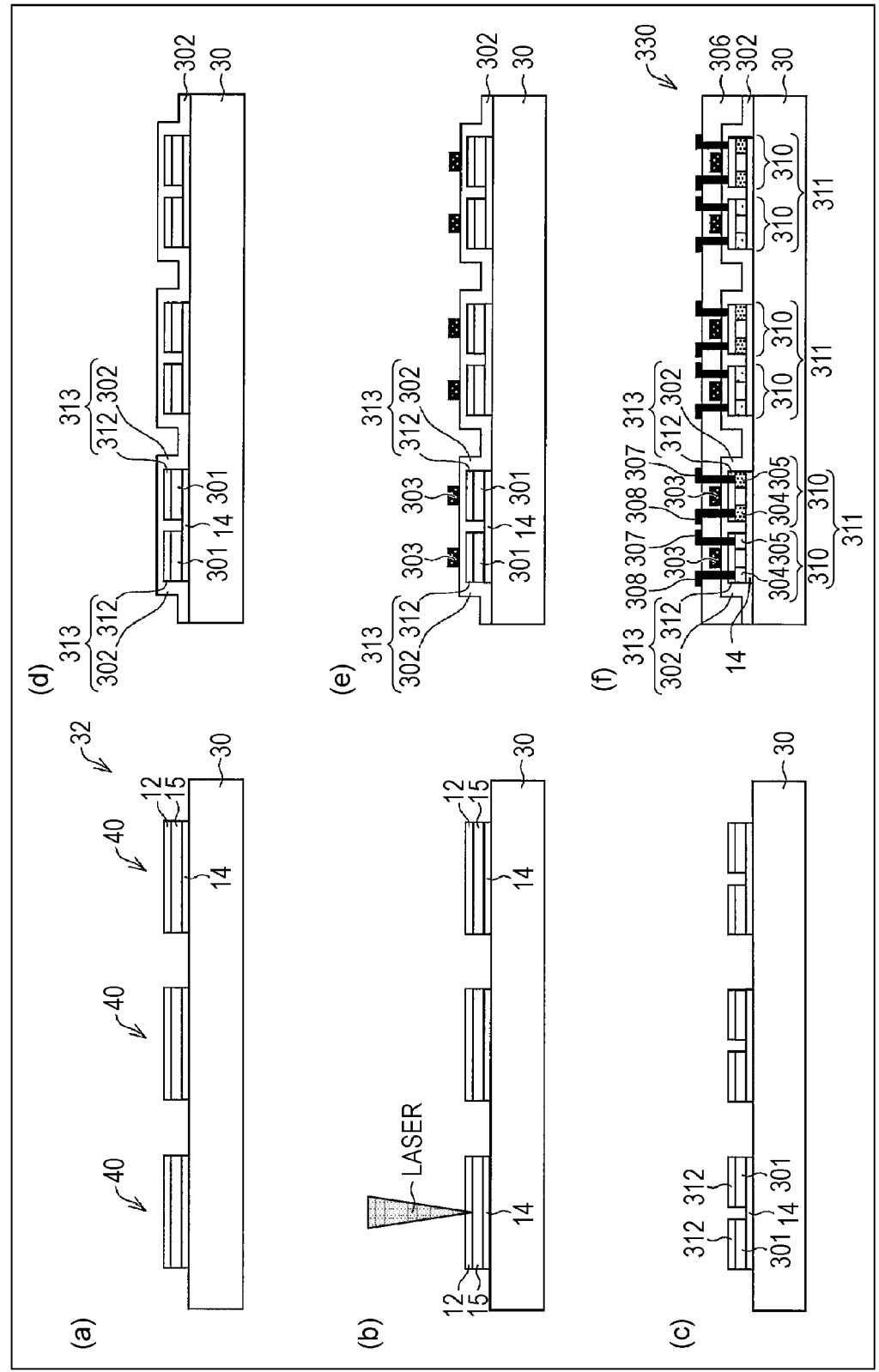
FIG. 14 is a diagram illustrating each step to form TFTs on the SOI substrate according to a second embodiment of the present invention.

Furthermore, as shown in FIG. 14 (a), the SOI substrate 32 subjected to the etch back treatment is obtained through the individual steps shown in FIG. 7 (a) to (f).

Next, in the present embodiment, after the SOI substrate 32 subjected to the etch back treatment is obtained, the step to remove the BOX layers 12 is not performed and, as shown in FIG. 14 (b), removal of peripheral portions of the BOX layers 12, SOI layers 15, and oxide films 14 and laser irradiation to the surface of the BOX layers 12 are performed by a step to remove the peripheral portion and a step to perform a laser treatment. Crystal defects generated by the ion implantation in the SOI layer 15 can be recovered by the laser irradiation. In the step to remove the peripheral portion and the step to perform a laser treatment, the same treatments as those explained with reference to FIG. 8 (a) can be employed.

In this regard, the step to remove the peripheral portion and the step to perform a laser treatment may be included optionally.

Subsequently, as shown in FIG. 14 (c), in a step to convert to islands, the BOX layer 12 and the SOI layer 15 thereunder, which have been optionally subjected to the laser treatment of the surfaces, are converted to islands (patterning) in a predetermined TFT pattern by, for example, photolithography. In this manner, a BOX layer 312 and a SOI layer 301, which are formed on the oxide film 14 and which are converted to islands in such a way as to expose part of the oxide film 14, are obtained.

Thereafter, as shown in FIG. 14 (d), in a step to form a gate insulating film, a gate insulating film (third insulating film) 302 is formed covering the BOX layers 312 and the SOI layers 301, which have been converted to islands, the exposed surfaces of the oxide films 14, and the base substrate 30 by, for example, a CVD method. In this manner, the gate insulating film 313, which is formed from the BOX layer 312 and the gate insulating film 302 and which has a predetermined film thickness, can be obtained on the SOI layers 301.

The thickness of the gate insulating film 302 formed in the present step is adjusted in such a way that the sum of the thickness of the BOX layer 312 not removed and the thickness of the gate insulating film 302 formed in the present step becomes the predetermined thickness of the gate insulating film 313.

The gate insulating film 302 is formed having a film thickness of about 20 nm or more and 200 nm or less. As for the material for the gate insulating film 302, $SiO_2$, SiON, a material by combination thereof, or the like can be used.

In the present step, the gate insulating film 302 is added afterward by the CVD method or the like and, thereby, the gate insulating film 313 having the predetermined film thickness is formed, so that the corner portions and the edge portions of the islands can be covered with the gate insulating film 313 completely and a TFT having a small gate leakage current and exhibiting excellent withstand voltage can be formed.

Then, as shown in FIG. 14 (e), in a step to form a gate electrode, a film of gate electrode material is formed above the SOI layer 301 and on the surface of the gate insulating film 302 (that is, surface of the gate insulating film 313) by, for example, a sputtering method, and a gate electrode 303 is patterned by photolithography.

Thereafter, as is explained with reference to FIG. 8 (e) to (g), the step to form a source region and a drain region, the step to form an interlayer insulating film, and the source electrode and drain electrode forming step are executed. Consequently, as shown in FIG. 14 (f), the gate insulating film 302 is formed on the BOX layers 312 and, thereby, a transistor substrate 330 including the gate insulating film 313 having a film thickness adjusted to a predetermined thickness can be obtained.

As described above, in the present embodiment, the BOX layer 12 and the SOI layer 15 are converted to islands by photolithography in the step to convert to islands, and the gate insulating film 302 is stacked in such a way that the film thickness thereof and the film thickness of the BOX layer 312 becomes the predetermined film thickness of the gate insulating film 313 and in such a way as to cover the BOX layer 312 and the SOI layer 301 in the step to form a gate insulating film. In this manner, the gate insulating film 313 having the predetermined film thickness is obtained.

According to this, the BOX layer 312 which is a high-quality insulating film having few defects at the interface (interface state) to the SOI layer 301 is utilized as part of the gate insulating film 313 and, therefore, a low-power consumption TFT element having excellent TFT characteristics (sharp S value) can be formed. In addition, the BOX layer 312 converted to islands are not removed and, therefore, the number of steps can be decreased.

[Third Embodiment]

Next, a third embodiment according to the present invention will be described with reference to FIG. 5 to FIG. 8 and FIG. 15 (a) to (e). In this regard, for the convenience of explanation, the members having the same functions as those in the drawings explained in the above-described first and second embodiments are indicated by the same reference numerals as those set forth above and the explanations thereof will not be provided.

As described above, in the first embodiment, the BOX layers of the SOI wafers 10 transferred to the base substrate 30 are removed, a new gate insulating film 302 is formed all over the surface and, thereby, the transistor substrate 300 is obtained.

Meanwhile, in the second embodiment, the BOX layers of the SOI wafers 10 transferred to the base substrate 30 are not removed, a gate insulating film is formed on the BOX layers to utilize the BOX layers as constituents of part of the gate insulating film having the predetermined film thickness and, thereby, the transistor substrate 330 is obtained.

On the other hand, the present third embodiment is different from the methods for manufacturing a semiconductor substrate described in the first and second embodiments in that the BOX layers are not removed, and the semiconductor substrate is obtained using the BOX layers in themselves as the gate insulating film.

The BOX layer 12 is a high-quality thermal oxidation film and, therefore, a TFT formed using this as the gate insulating film exhibits good interfacial characteristics (sharp S value). Steps to produce this semiconductor substrate are substantially the same as those in the first and second embodiments, so that different points are mainly explained.

Initially, a SOI wafer is obtained in which the film thickness of the BOX layer is 50 nm or less. This SOI wafer can be formed by using, for example, the Smart Cut method, as described above.

As shown in FIG. 5 (a), initially, in the step to form the thermal oxidation film, the Si wafer made from single crystal Si is subjected to the thermal oxidation treatment and, thereby, the thermal oxidation film ($SiO_2$) 12' is formed on the surface of the single crystal Si layer 2. In this manner, the Si wafer 1 in which the thermal oxidation film 12' is disposed on the surface of the single crystal Si layer 2 is obtained.

Here, the thermal oxidation film 12' serves as the BOX layer 12 thereafter and is formed in such a way that the film thickness becomes 50 nm or less. Furthermore, the thermal oxidation film 12' functions as a gate insulating film, and the oxidation time of the thermal oxidation film formation is adjusted in advance in such a way that a predetermined film thickness of the gate insulating film is ensured.

As an example, the single crystal silicon substrate is subjected to a wet oxidation treatment at 850° C. For example, the thermal oxidation treatment may be performed for about 15 min in the case where about 20 nm of thermal oxidation film 12' is formed and for about 45 min in the case where abut 50 nm is formed.

Subsequently, as is explained with reference to FIG. 5 (b) to (e), the Si wafer 1 is subjected to the individual treatments of the step to form the fragile layer, the step to perform the surface treatment, the bonding step, and the step to transfer single crystal Si to the support substrate sequentially and, thereby, the SOI wafer 10 can be obtained.

Then, as is explained with reference to FIG. 6 (a) to (e), the SOI wafer 10 and the base substrate 30 are obtained through the individual steps before bonding of the SOI wafer to the insulating substrate.

Figure 15:
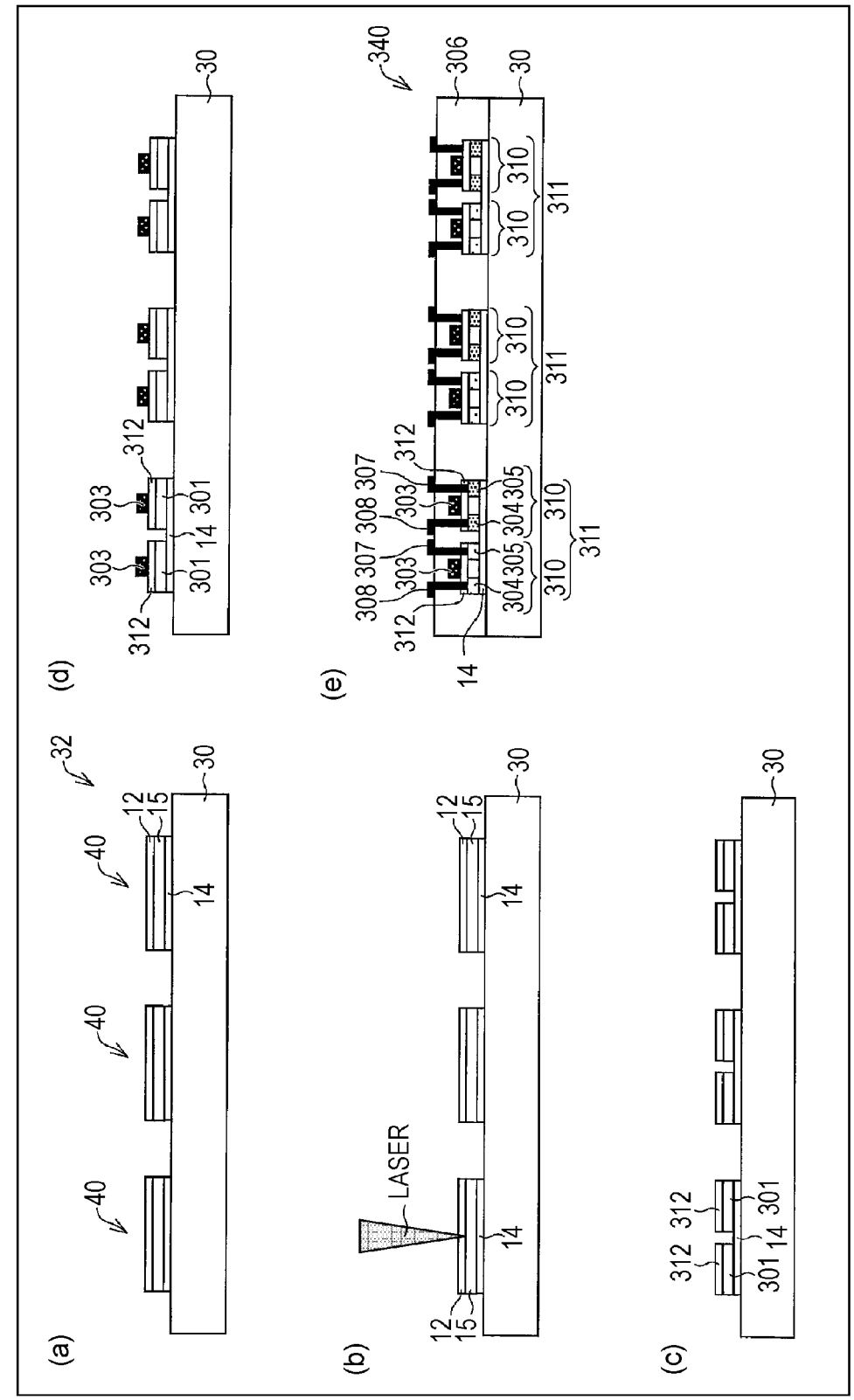
FIG. 15 is a diagram illustrating each step to form TFTs on the SOI substrate according to a third embodiment of the present invention.
Figure 16:
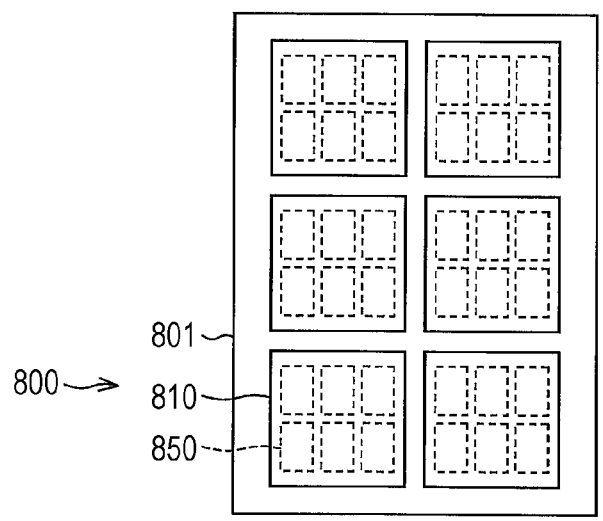
FIG. 16 is a diagram of a conventional semiconductor substrate before an etch back treatment, (a) shows a plane, and (b) shows a cross section.
Figure 16:
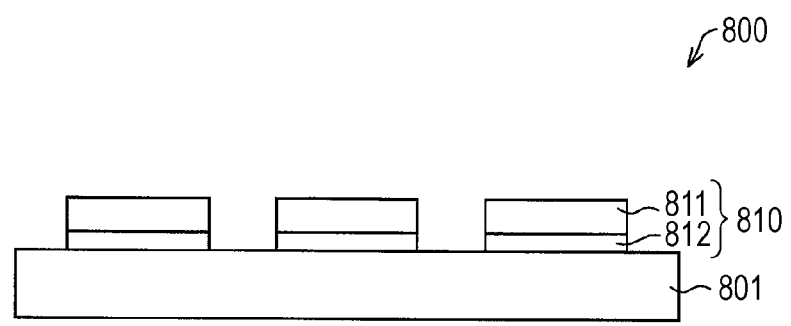
Figure 17:
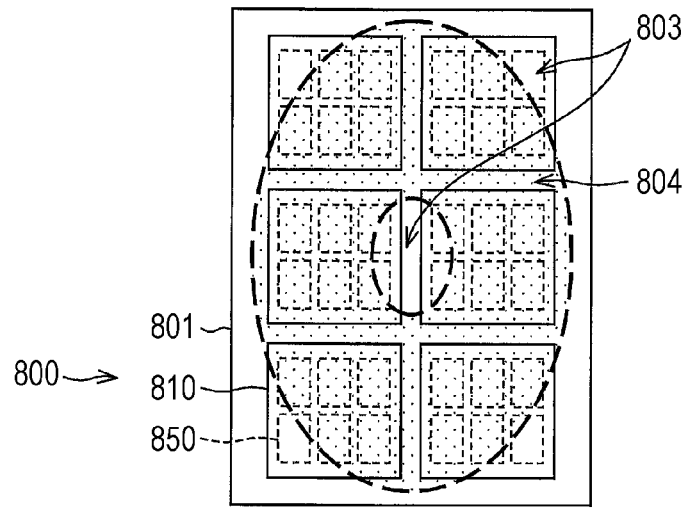
FIG. 17 is a diagram of a conventional semiconductor substrate after an etch back treatment, (a) shows a plane, and (b) shows a cross section.
Figure 17:
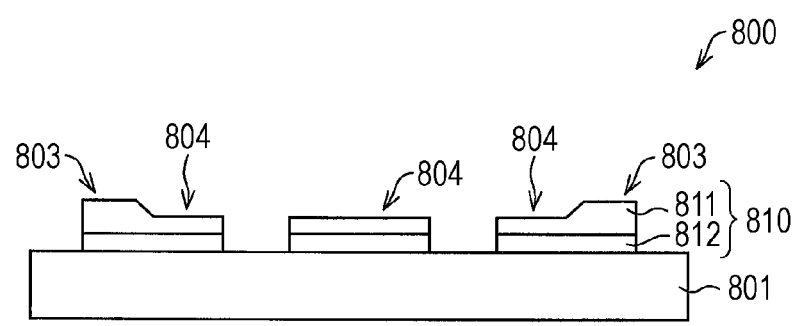
Figure 18:
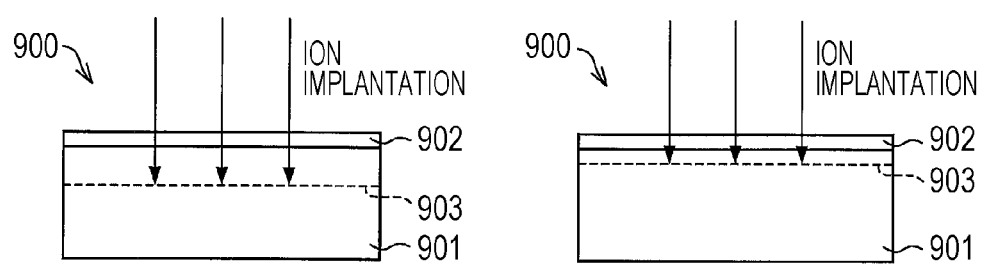
FIG. 18 is a diagram showing a conventional single crystal Si wafer, (a) shows a manner of formation of a fragile layer in a single crystal Si layer of a single crystal Si wafer, and (b) shows a manner of separation of a single crystal Si wafer at a fragile layer.
Figure 18:
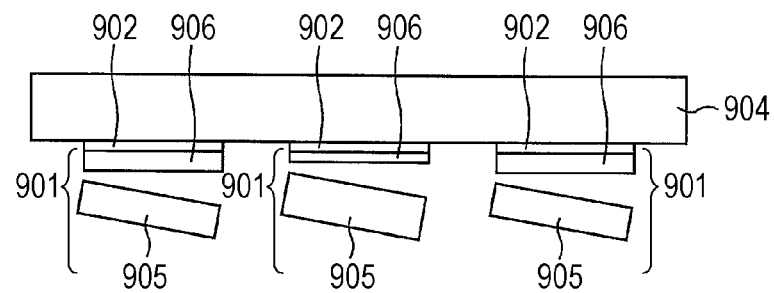
Figure 19:
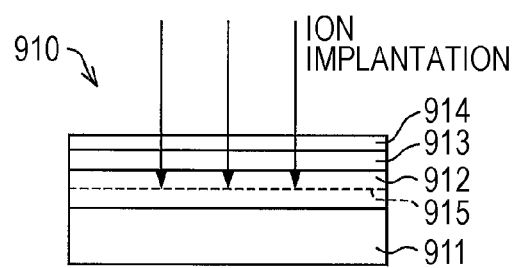
FIG. 19 is a diagram showing a conventional SOI wafer, (a) shows a manner of formation of a fragile layer in a BOX layer of a SOI wafer, and (b) shows a manner of separation of a SOI wafer at a fragile layer.
Figure 19:
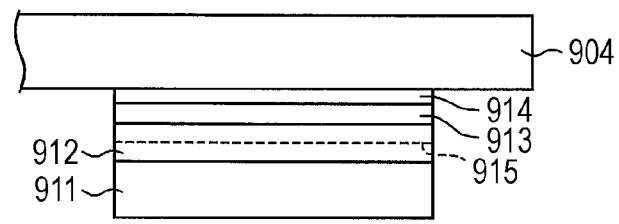

Furthermore, as shown in FIG. 15 (a), the SOI substrate 32 subjected to the etch back treatment is obtained through the individual steps shown in FIG. 7 (a) to (f).

Next, after the SOI substrate 32 subjected to the etch back treatment is obtained, the step to remove the BOX layers 12 is not performed and, as shown in FIG. 15 (b), removal of peripheral portions of the BOX layers 12, SOI layers 15, and oxide films 14 and laser irradiation to the surface of the BOX layers 12 are performed by a step to remove the peripheral portion and a step to perform a laser treatment. Crystal defects generated by the ion implantation in the SOI layer 15 can be recovered by the laser irradiation. In the step to remove the peripheral portion and the step to perform a laser treatment, the same treatments as those explained with reference to FIG. 8 (a) and FIG. 14 (b) can be employed.

In this regard, the step to remove the peripheral portion and the step to perform a laser treatment may be included optionally.

Subsequently, as shown in FIG. 15 (c), in a step to convert to islands, the BOX layer 12 and the SOI layer 15 thereunder, which have been optionally subjected to the laser treatment of the surfaces, are converted to islands in a predetermined TFT pattern by, for example, photolithography. In this manner, a BOX layer 312 and a SOI layer 301, which are formed on the oxide film 14 and which are converted to islands in such a way as to expose part of the oxide film 14, are obtained.

Thereafter, in the present embodiment, as shown in FIG. 15 (d), in a step to form a gate electrode, a film of gate electrode material is formed above the SOI layer 301 and on the surface of the BOX layer 312 by, for example, a sputtering method without executing the step to form a gate insulating film, and a gate electrode 303 is patterned by photolithography.

As described above, in the present embodiment, the BOX layer 12 and the SOI layer 15 are converted to islands in the step to convert to islands and, then, the gate electrode 303 is formed on the BOX layer 312 converted to the islands in the step to form a gate electrode. In this regard, a gate wiring layer is disposed separately as a layer different from the gate electrode to employ the form of a multilayer wiring.

According to this, the BOX layer 12 which is a high-quality insulating film having few defects at the interface (interface state) to the SOI layer 15 is utilized as the gate insulating film on an as-is basis and, therefore, a low-power consumption TFT element having excellent TFT characteristics (sharp S value) can be formed. Meanwhile, the step to remove the BOX layer 312 can be omitted and, in addition, the step to form an insulating film on the BOX layer 312 to adjust the film thickness can be omitted. Therefore, the number of steps can be further decreased as compared with that in the method for manufacturing a semiconductor substrate explained in the second embodiment.

Thereafter, as is explained with reference to FIG. 8 (e) to (g), the step to form a source region and a drain region, the step to form an interlayer insulating film, and the source electrode and drain electrode forming step are executed. Consequently, as shown in FIG. 15 (e), a transistor substrate 340 not including the gate insulating film 302 but including the BOX layer 312 functioning as a gate insulating film can be obtained.

In this regard, it is preferable that a step to apply ions from the surface side of the above-described first insulating film of the above-described stacked substrate to form the above-described fragile layer in the inside of the above-described support substrate be included.

According to the above-described configuration, the above-described second insulating film is disposed between the above-described single crystal semiconductor film transferred to the base substrate after being separated at the fragile layer and the part of the above-described support substrate. Therefore, when the above-described base substrate is subjected to the etch back treatment to etch part of the above-described transferred support substrate, the above-described second insulating film functions as an etch stopper, and etching of the above-described single crystal semiconductor film can be prevented.

Consequently, the semiconductor substrate can be obtained, in which film thickness variations of the plurality of single crystal semiconductor films disposed on the above-described base substrate are suppressed.

Meanwhile, the film thickness of the above-described second insulating film in the above-described stacked substrate is preferably less than or equal to one-third the sum of the film thicknesses of the above-described first insulating film and the above-described single crystal semiconductor film.

According to the above-described configuration, the film thickness of the above-described second insulating film is small and, therefore, when ions are applied from the above-described first insulating film side, the ions concerned pass through the above-described first insulating film, the above-described single crystal semiconductor film, and the above-described second insulating film. Consequently, the above-described fragile layer can be formed in the inside of the above-described support substrate. In this manner, according to the above-described configuration, even when the above-described second insulating film is disposed between the above-described single crystal semiconductor film and the above-described support substrate, the above-described fragile layer can be formed in the inside of the above-described support substrate.

In addition, the implantation depth of ion (depth of the fragile layer to be formed) can be set to be small, so that the acceleration voltage in ion irradiation can be decreased. Therefore, the temperature of the ion-implanted substrate is suppressed from becoming high and, as a result, the amount of implantation of ions can be increased. Consequently, ions can be applied in a treatment time capable of ensuring the throughput at a mass production level and, in addition, the above-described fragile layer can be formed in the inside of the above-described support substrate. In this manner, a semiconductor substrate suitable for mass production can be obtained.

Meanwhile, the film thickness of the above-described second insulating film is preferably 50 nm or less. According to the above-described configuration, the film thickness of the above-described second insulating film is small and, therefore, the above-described fragile layer can be formed in the inside of the above-described support substrate reliably.

Also, the film thickness of the above-described single crystal semiconductor film is preferably 50 nm or more and 200 nm or less.

According to the above-described configuration, for example, a semiconductor substrate including a single crystal semiconductor film having a film thickness suitable for TFT elements for the use of liquid crystal displays and organic EL displays can be obtained.

Also, the sum of the film thicknesses of the first insulating film, the above-described single crystal semiconductor film, and the above-described second insulating film is preferably 350 nm or less.

According to the above-described configuration, the distance from the first insulating film surface to the support substrate is small, the implantation depth of ion (depth of the fragile layer to be formed) can be set to be small, so that the acceleration voltage in ion irradiation can be decreased. Therefore, the temperature of the ion-implanted substrate can be suppressed from becoming high by decreasing the acceleration voltage and, as a result, the amount of implantation of ions can be increased. Consequently, ions can be applied in a treatment time of such an extent that the throughput at a mass production level can be ensured and, in addition, the above-described fragile layer can be formed in the inside of the above-described support substrate reliably. In this manner, a semiconductor substrate suitable for mass production can be obtained.

Here, it is believed that the region in which the crystal structure is collapsed by ion irradiation and crystal defects and damage are included is approximately within the projection dispersion ($\Delta Rp \approx 100$ nm) from a peak of implantation (Rp). Even when this projection dispersion is taken into consideration, it is possible to form the above-described fragile layer in the above-described support substrate disposed under the above-described second insulating film reliably without damaging the above-described single crystal semiconductor film by employing the above-described configuration.

Meanwhile, the above-described ion is a $H^+$ ion, a $H_2^+$ ion, or a $H_3^+$ ion. In the case where the above-described $H^+$ ion is mainly applied, preferably, the acceleration voltage is 10 keV or more and 40 keV or less and the amount of implantation is $1\times10^{16}/cm^2$ or more and $1\times10^{17}/cm^2$ or less. In the case where the above-described $H_2^+$ ion is mainly applied, preferably, the acceleration voltage is 30 keV or more and 90 keV or less and the amount of implantation is $1\times10^{16}/cm^2$ or more and $1\times10^{17}/cm^2$ or less. In the case where the above-described $H_3^+$ ion is mainly applied, preferably, the acceleration voltage is 55 keV or more and 150 keV or less and the amount of implantation is $1\times10^{16}/cm^2$ or more and $1\times10^{17}/cm^2$ or less.

According to the above-described configuration, when ions are applied from the above-described first insulating film side, the ions concerned pass through the above-described first insulating film, the above-described single crystal semiconductor film, and the above-described second insulating film, and the above-described fragile layer can be formed in the inside of the above-described support substrate reliably.

Furthermore, the acceleration voltage in ion irradiation is lower than that in the case where a common SOI wafer is irradiated and, thereby, the temperature of the ion-implanted substrate can be suppressed from becoming high and the amount of implantation of ions can be increased. Consequently, it is possible that ions are applied in a treatment time of such an extent that the throughput does not decrease and the above-described fragile layer is formed in the inside of the above-described support substrate. Therefore, a semiconductor substrate suitable for mass production can be obtained.

Also, it is preferable that a step to remove the above-described exposed second insulating film and expose the above-described plurality of single crystal semiconductor films be included.

According to the above-described configuration, a gate insulating film can be formed again all over the semiconductor substrate while the above-described second insulating film has been removed. Therefore, the film thickness of the gate insulating film is adjusted easily. In addition, a highly versatile semiconductor substrate capable of forming a TFT and the like compatible with various processes (for liquid crystal, for organic EL, and the like) can be obtained.

Also, it is preferable that the above-described second insulating film be removed by wet etching. According to the above-described configuration, etching can proceed all over the above-described base substrate uniformly with small in-plane distribution, so that a semiconductor substrate can be obtained, in which the film thicknesses of a plurality of single crystal semiconductor films disposed on the above-described base substrate are uniform.

Also, it is preferable that a step to pattern the above-described exposed second insulating film and single crystal semiconductor film by photolithography and a step to form a gate insulating film by stacking a third insulating film covering the above-described patterned second insulating film and single crystal semiconductor film in such a way that the film thickness combined with the second insulating film becomes a predetermined film thickness of the above-described gate insulating film be included.

According to the above-described configuration, the above-described second insulating film which is a high-quality insulating film having few defects at the interface (interface state) to the above-described single crystal semiconductor film is utilized as part of the gate insulating film and, therefore, a low-power consumption TFT element having excellent TFT characteristics (sharp S value) can be formed. Meanwhile, the above-described patterned second insulating film is not removed and, therefore, the number of steps can be decreased.

Also, it is preferable that a step to pattern the above-described exposed second insulating film and single crystal semiconductor film by photolithography and a step to form a gate electrode on the above-described patterned second insulating film be included. According to the above-described configuration, the above-described second insulating film which is a high-quality insulating film having few defects at the interface (interface state) to the above-described single crystal semiconductor film is utilized as the gate insulating film on an as-is basis and, therefore, a low-power consumption TFT element having excellent TFT characteristics (sharp S value) can be formed. Meanwhile, the above-described patterned second insulating film is not removed, nor is another insulating film stacked thereon to adjust the film thickness. Therefore, the number of steps can be decreased.

Also, it is preferable that laser be applied to the above-described exposed plurality of single crystal semiconductor films or the above-described patterned single crystal semiconductor films.

According to the above-described configuration, the single crystal semiconductor film can be recrystallized by the laser, so that protruded portions on the surface of the single crystal semiconductor film are eliminated and planarization can be performed. In this manner, the semiconductor substrate capable of forming a high-voltage TFT element can be obtained. Also, defects in the inside of the single crystal semiconductor film generated because of ion implantation can be repaired and reduced by recrystallization through the laser. Consequently, the semiconductor substrate capable of forming a high-performance TFT element having few defects can be obtained.

The above-described second insulating film is preferably made from a material having a selection ratio of 2 or more relative to the above-described support substrate in the above-described etch back treatment. Consequently, the second insulating film is allowed to function as an etch stopper sufficiently, so that etching of the above-described single crystal semiconductor film can be prevented.

Therefore, the semiconductor substrate in which film thickness variations of the plurality of single crystal semiconductor films disposed on the above-described base substrate are suppressed can be obtained.

Meanwhile, it is preferable that the above-described second insulating film be a BOX layer, the above-described single crystal semiconductor film be a SOI layer, the above-described first insulating film be at least one of $SiO_2$, SiON, SiNO, and $SiN_x$, which are formed by thermal oxidation, and the above-described base substrate be a glass substrate.

Also, an electronic device may be formed using a semiconductor substrate produced by the above-described method for manufacturing a semiconductor substrate. Furthermore, an electronic apparatus may be formed using the above-described electronic device.

Also, in the semiconductor substrate according to the present invention, the above-described support substrate can be removed from the above-described substrate for forming the semiconductor substrate and a semiconductor can be disposed in such a way that the above-described second insulating film serves as a gate insulating film.

Also, in the semiconductor substrate according to the present invention, the above-described gate insulating film can be formed from only the above-described second insulating film.

The present invention is not limited to the above-described embodiments, various modifications can be made within the scope of the claims, and embodiments obtained by combining the individual technical measures disclosed in the different embodiments are included in the technical scope of the present invention.

INDUSTRIAL APPLICABILITY

The present invention can be utilized for a method for manufacturing a SOI substrate required to have a uniform film thickness, a thin film transistor produced using the SOI substrate, and various electronic devices.

REFERENCE SIGNS LIST

6·16 hydrogen ion (ion)
7·17 fragile layer
18 single crystal Si layer (part of support substrate)
10 SOI wafer (stacked substrate)
12·312 BOX layer (second insulating film)
13 Si support substrate (support substrate)
14 oxide film (first insulating film)
15·301 SOI layer (single crystal semiconductor film)
30 base substrate
31 bonded substrate (substrate for forming semiconductor substrate)
32 SOI substrate (semiconductor substrate)
32' bonded substrate
33 SOI substrate (semiconductor substrate)
302 gate insulating film (third insulating film)
303 gate electrode
304 drain region
305 source region
306 interlayer insulating film
307 source electrode
308 drain electrode 310 TFT
313 gate insulating film
314 interlayer insulating film
320 active matrix substrate
330·340 transistor substrate
400 liquid crystal panel
450 liquid crystal display device (electronic device)
500 electroluminescent device (electronic device)
600 radio communication device (electronic device)
750 personal computer (electronic apparatus)
760 cellular phone (electronic apparatus)
770 radio communication apparatus (electronic apparatus)
780 organic EL illumination (electronic apparatus)
790 LED bulb (electronic apparatus)

The invention claimed is:

1. A method for manufacturing a semiconductor substrate in which a plurality of single crystal semiconductor films are disposed on a base substrate, the method characterized by comprising steps of:
    bonding a plurality of stacked substrates, in which a first insulating film, a single crystal semiconductor film, a second insulating film, and a support substrate having a fragile layer formed by ion irradiation in the inside and being made from a single crystal semiconductor material are stacked sequentially, to a base substrate in such a way that the first insulating film is located on a side close to the base substrate;
    applying heat to the plurality of stacked substrates to separate part of the support substrate at the fragile layer and transfer the first insulating film, the single crystal semiconductor film, the second insulating film, and part of the support substrate to the base substrate; and
    subjecting the base substrate to an etch back treatment to expose the second insulating film by etching part of the transferred support substrate.

2. The method for manufacturing a semiconductor substrate, according to claim 1, the method characterized by comprising a step of applying ions from the surface side of the first insulating film in a stacked substrate to form the fragile layer in the inside of the support substrate.

3. The method for manufacturing a semiconductor substrate, according to claim 1, the method characterized in that a film thickness of the second insulating film in a stacked substrate is less than or equal to one-third the sum of the film thicknesses of the first insulating film and the single crystal semiconductor film.

4. The method for manufacturing a semiconductor substrate, according to claim 3, the method characterized in that the film thickness of the second insulating film is 50 nm or less.

5. The method for manufacturing a semiconductor substrate, according to claim 3, the method characterized in that a film thickness of the single crystal semiconductor film is 50 nm or more and 200 nm or less.

6. The method for manufacturing a semiconductor substrate, according to claim 3, the method characterized in that a sum of film thicknesses of the first insulating film, the single crystal semiconductor film, and the second insulating film is 350 nm or less.

7. The method for manufacturing a semiconductor substrate, according to claim 2, the method characterized in that the ions include a $H^+$ion, a $H2^+$ion, or a $H_3+$ion,
    in the a case where the $H^+$ion is mainly applied, an acceleration voltage is 10 keV or more and 40 keV or less and an amount of implantation is $1\times10^{16}/cm^2$ or more and $1\times10^{17}/cm^2$ or less,
    in a case where the $H2^+$ion is mainly applied, an acceleration voltage is 30 keV or more and 90 keV or less and an amount of implantation is $1\times10^{16}/cm^2$ or more and $1\times10^{17}/cm^2$ or less, and
    in a case where the $H_3+$ion is mainly applied, an acceleration voltage is 55 keV or more and 150 keV or less and an amount of implantation is $1\times10^{16}/cm^2$ or more and $1\times10^{17}/cm^2$ or less.

8. The method for manufacturing a semiconductor substrate, according to claim 1, the method characterized by comprising a step of removing the exposed second insulating films to expose the plurality of single crystal semiconductor films.

9. The method for manufacturing a semiconductor substrate, according to claim 8, the method characterized in that the second insulating film is removed by wet etching.

10. The method for manufacturing a semiconductor substrate, according to claim 1, the method characterized by comprising steps of:
    patterning the exposed second insulating film and single crystal semiconductor film by photolithography; and
    forming a gate insulating film by stacking a third insulating film covering the patterned second insulating film and single crystal semiconductor film in such a way that a film thickness combined with the second insulating film becomes a predetermined film thickness of the gate insulating film.

11. The method for manufacturing a semiconductor substrate, according to claim 1, the method characterized by comprising steps of:
    patterning the exposed second insulating film and single crystal semiconductor film by photolithography; and
    forming a gate electrode on the patterned second insulating film.

12. The method for manufacturing a semiconductor substrate, according to claim 8, the method characterized in that laser is applied to an exposed plurality of single crystal semiconductor films or patterned single crystal semiconductor films.

13. The method for manufacturing a semiconductor substrate, according to claim 1, the method characterized in that the second insulating film is made from a material having a selection ratio of 2 or more relative to the support substrate in the etch back treatment.

14. The method for manufacturing a semiconductor substrate, according to claim 1, the method characterized in that the second insulating film is a BOX layer, the single crystal semiconductor film is a SOI layer, the first insulating film is at least one of $SiO_2$, SiON, SiNO, and $SiN_x$, which are formed by thermal oxidation, and the base substrate is a glass substrate.

15. An electronic device which includes the semiconductor substrate according to claim 1.

16. A substrate for forming a semiconductor substrate, for the purpose of forming a semiconductor substrate in which a plurality of single crystal semiconductor films are disposed on a base substrate, characterized in that
    a plurality of stacked substrates, in which a first insulating film, a single crystal semiconductor film, a second insulating film, and a support substrate having a fragile layer formed by ion irradiation and being made from a single crystal semiconductor material are stacked sequentially, are bonded to a base substrate in such a way that the first insulating film is located on a side close to the base substrate, and a film thickness of the second insulating film in a stacked substrate is less than or equal to one-third a sum of the film thicknesses of the first insulating film and the single crystal semiconductor film.

17. A stacked substrate to be bonded to a base substrate for forming a semiconductor substrate in which a plurality of single crystal semiconductor films are disposed on the base substrate, characterized in that
a first insulating film, a single crystal semiconductor film, a second insulating film, and a support substrate having a fragile layer formed by ion irradiation and being made from a single crystal semiconductor material are stacked sequentially, and
a film thickness of the second insulating film is less than or equal to one-third a sum of the film thicknesses of the first insulating film and the single crystal semiconductor film.

18. A semiconductor substrate characterized in that
in the substrate for forming a semiconductor substrate according to claim 16, a support substrate is removed, and
a semiconductor is disposed in such a way that the second insulating film serves as a gate insulating film.

19. The semiconductor substrate according to claim 18, characterized in that the gate insulating film is formed from only the second insulating film.

* * * * *